US009817026B2

(12) United States Patent
Edwards et al.

(10) Patent No.: US 9,817,026 B2
(45) Date of Patent: Nov. 14, 2017

(54) WAFER LEVEL INTEGRATED CIRCUIT CONTACTOR AND METHOD OF CONSTRUCTION

(71) Applicant: Johnstech International Corporation, Minneapolis, MN (US)

(72) Inventors: Jathan Edwards, Afton, MN (US); Charles Marks, Minneapolis, MN (US); Brian Halvorson, St. Paul, MN (US)

(73) Assignee: Johnstech International Corporation, Minneapolis, MN (US)

( * ) Notice: Subject to any disclaimer, the term of this patent is extended or adjusted under 35 U.S.C. 154(b) by 130 days.

(21) Appl. No.: 15/043,898

(22) Filed: Feb. 15, 2016

(65) Prior Publication Data

US 2016/0161528 A1    Jun. 9, 2016

Related U.S. Application Data

(63) Continuation of application No. 13/921,484, filed on Jun. 19, 2013, now Pat. No. 9,261,537.

(Continued)

(51) Int. Cl.
  *G01R 31/20*  (2006.01)
  *G01R 1/067*  (2006.01)
  (Continued)

(52) U.S. Cl.
  CPC ..... *G01R 1/06733* (2013.01); *G01R 1/07307* (2013.01); *G01R 3/00* (2013.01); *G01R 31/2601* (2013.01); *Y10T 29/49204* (2015.01)

(58) Field of Classification Search
  CPC ............ G01R 31/2891; G01R 31/2601; G01R 31/2886; G01R 31/2887; G01R 1/067;
  (Continued)

(56) References Cited

U.S. PATENT DOCUMENTS 5,098,311 A * 3/1992 Roath ................... H01R 13/28
                                                    439/290
5,947,749 A    9/1999 Rathburn
(Continued)

FOREIGN PATENT DOCUMENTS

EP    0462706    12/1991

OTHER PUBLICATIONS

Supplemental European Search Report for European application No. 13806898.6 dated Feb. 17, 2016.
(Continued)

*Primary Examiner* — Minh N Tang
(74) *Attorney, Agent, or Firm* — Altera Law Group, LLC

(57) ABSTRACT

A testing device for wafer level testing of IC circuits is disclosed. An upper and lower pin (22, 62) are configured to slide relatively to each other and are held in electrically biased contact by an elastomer (80). The elastomer is precompressed from its natural rest state between a top (22) plate and a bottom (70). Pre compression improves the resilient response of the pins. The pin crowns (40) are maintained relatively coplanar by the engagement of at least one flange (44*a-b*) against an up-stop surface 90 of plate 20, thereby insuring coplanarity of the crowns. The pin guide (12) is maintained in alignment with the retainer 14 by establishing a registration corner (506) and driving the guide into the corner by elastomers in at least one diagonally opposite corner.

11 Claims, 36 Drawing Sheets

Related U.S. Application Data

(60) Provisional application No. 61/662,124, filed on Jun. 20, 2012, provisional application No. 61/760,928, filed on Feb. 5, 2013.

(51) Int. Cl.
*G01R 1/073* (2006.01)
*G01R 3/00* (2006.01)
*G01R 31/26* (2014.01)

(58) Field of Classification Search
CPC .... G01R 1/06733; G01R 1/073; G01R 1/07307; H01R 13/28; H01R 13/2428; H01R 13/2407; H01R 13/2435
See application file for complete search history.

(56) References Cited

U.S. PATENT DOCUMENTS

| | | |
|---|---|---|
| 5,949,244 A | 9/1999 | Miley |
| 6,046,597 A | 4/2000 | Barabi |
| 6,181,149 B1 | 1/2001 | Godfrey et al. |
| 7,170,306 B2 | 1/2007 | Karavakis |
| 7,176,702 B2 | 2/2007 | Cram |
| 7,367,813 B2 | 5/2008 | Matsuo |
| 7,695,286 B2 * | 4/2010 | Swart .................. H01R 12/714 439/66 |
| 9,007,082 B2 | 4/2015 | Nelson |
| 2007/0103179 A1 | 5/2007 | Tsai et al. |
| 2012/0062261 A1 | 3/2012 | Nelson |
| 2013/0342233 A1 | 12/2013 | Edwards et al. |

OTHER PUBLICATIONS

International Search Report for PCT Application No. PCT/2013/046604 dated Nov. 29, 2013.
Written Opinion and International Search Report for International application No. PCT/US2015/19602 dated Jul. 20, 2015.

\* cited by examiner

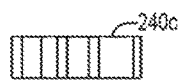
Fig. 24A
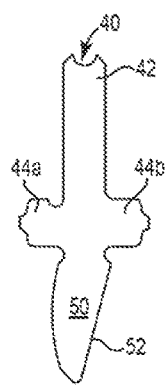
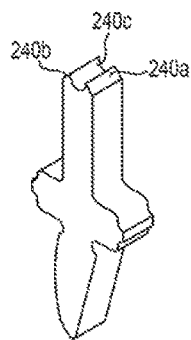
Fig. 24B        Fig. 24C        Fig. 24D        Fig. 24E
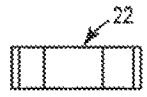
Fig. 24F

Fig. 26A
 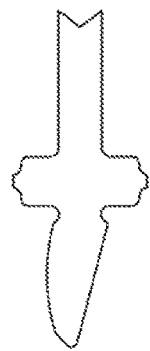  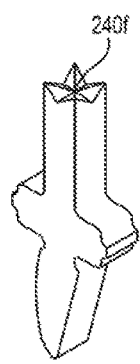
Fig. 26B   Fig. 26C   Fig. 26D   Fig. 26E
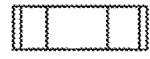
Fig. 26F

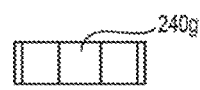
Fig. 27A
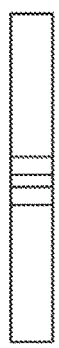 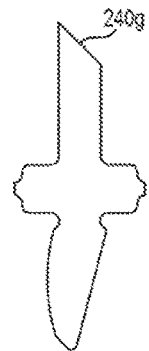 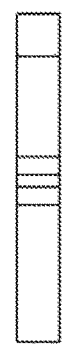 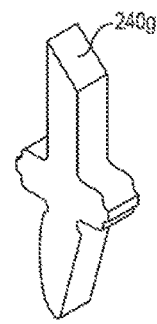
Fig. 27B          Fig. 27C          Fig. 27D          Fig. 27E
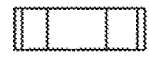
Fig. 27F

Fig. 28A
   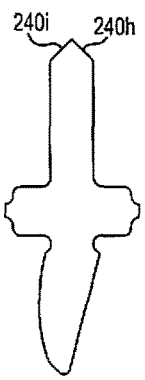   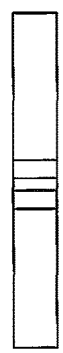   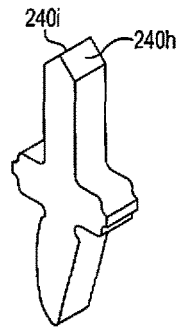
Fig. 28B        Fig. 28C        Fig. 28D        Fig. 28E
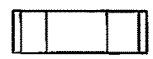
Fig. 28F

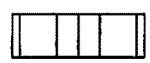
Fig. 29A
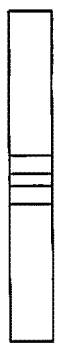 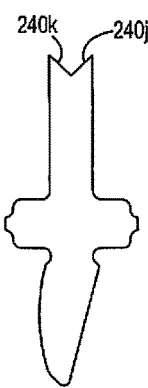  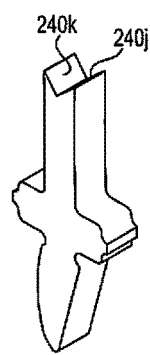
Fig. 29B　　Fig. 29C　　Fig. 29D　　Fig. 29E
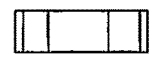
Fig. 29F

WAFER LEVEL INTEGRATED CIRCUIT CONTACTOR AND METHOD OF CONSTRUCTION

CROSS-REFERENCE TO RELATED APPLICATIONS

This applications claims priority of and incorporates by reference in its entirety, the following applications: US-2010/0231251-A1 (U.S. Ser. No. 12/721,039), now U.S. Pat. No. 8,536,889 filed 10 Mar. 2010; U.S. Ser. No. 13/343,328, abandoned filed 4 Jan. 2012 as a CIP of Ser. No. 13/226,606, abandoned which claims priority to provisional 61/380,494 filed 7 Sep. 2010 and 61/383,411 filed 16 Sep. 2010 and US-2012/0092034-A1 (U.S. Ser. No. 13/276,893), now U.S. Pat. No. 8,988,090 filed 19 Oct. 2011 which itself is a CIP of Ser. No. 12/764,603, now U.S. Pat. No. 8,558,554 filed 21 Apr. 2010 which claims 61/171,141 filed 21 Apr. 2009, 61/257,236 filed 2 Nov. 2009 and 61/307,501 filed 24 Feb. 2010.

BACKGROUND

Field of the Disclosure

The present invention concerns integrated circuit fabrication and testing. More particularly, the present invention concerns a methodology and structure for testing multiple integrated circuit dies residing on a semiconductor wafer substrate.

Description of the Related Art

Conventional integrated circuit fabrication techniques normally involve the formation of several individual integrated circuit devices on a single semiconductor substrate, termed a wafer. After fabrication is completed the wafer is normally cut or scribed to separate the individual integrated circuit devices into individual devices, commonly called singulated devices or die, or into rows of devices, commonly called strips. Usually the individual singulated integrated circuit devices, "chips", called dies or dice, are spaced apart from one another on the wafer to accommodate the cutting tool used to segment the wafer. The wafer thus has the appearance of a series of integrated circuit dies (dice) separated by intersecting lines that accommodate the cutting operation. These lines are commonly referred to as scribing lines, streets or lanes. Such dice can be placed into IC packaging and wires connected from the die to leads within the IC package. Testing can then be done on the package leads or contacts, which are relatively speaking much larger than the contact on the IC dies. The technology used for testing IC leaded packages therefore is not particularly analogous to wafer level testing and we have found principles from IC packed lead testing will not work without substantial modification and inventive input.

In many instances it is deemed advantageous to test the electrical functionality of the individual integrated circuit dies either at the wafer level or at the strip level. That is, before the wafer is segmented and the individual integrated circuit dies are separated from one another. Typically this testing is performed by placing a series of test probes in contact with electrical input and output (I/O) pads, or bonding pads or bumps that are formed on an exposed surface of each integrated circuit die. These I/O pads are usually connected to elements of a leadframe if the integrated circuit die is subsequently packaged. An example of such a tester is shown in U.S. Pat. No. 5,532,174 to Corrigan.

Semiconductor integrated circuit devices ("die") can also be tested while they are still present on the semiconductor wafer on which they were formed. Such wafer level testing is traditionally accomplished on a per chip basis, in which probe tips are brought into contact with bond pads for a given chip using precision wafer handling system commonly called a wafer prober. For each application, a specifically designed spatial configuration of probes are matched to the spatial array of bonding pads in what is commonly called a probe array. In the wafer prober, either a single die or a plurality of die may be stimulated and tested through the probe tips via a tester. In the case where a single die is tested for each wafer prober index step, the probe array is commonly called single site. In the case where 2 or more die are tested for each wafer prober index step, the probe array is commonly called multi-site. After single or multisite die are tested, the wafer prober system indexes to the next die or set of die which are similarly tested, etc. The probe array are commonly fastened onto a Printed Circuit Board (PCB) element to enable routing of signal lines to connect with Test system; said assemble of probe array and PCB are commonly called a probe card.

However, wafer prober and large probe array systems also exist which are capable of testing an entire semiconductor wafer, either all dies (ie chips) on the wafer simultaneously or a significant fraction of the dies on the wafer simultaneously. Furthermore, such systems may also be used to test the die on the wafer beyond basic functionality to stress the chips for a limited period of time for the purpose of weeding out early latent failures, what is known in the art as "burn in". An exemplary system is shown in U.S. Pat. No. 7,176,702 to Cram.

BRIEF SUMMARY OF THE DISCLOSURE

The following summary is intended to assist the reader in understanding the full disclosure and the claims. The claims define the scope of the invention, not this summary.

Disclosed is a test contact pin assembly or probe array for temporary contact with a test pads on a wafer level integrated circuit device wherein the test pads includes metallic film, electroplated bump or solder ball material affixed to make electrical connection with test die on the wafers. The disclosed test contact pin assembly incorporates at least one upper terminal pin, further having a longitudinal extension, at least one lateral flange or some other contact surface, and a contact surface for contacting lower terminal pin. The disclosed test contact pin assembly further incorporates at least one lower terminal pin having a contact surface for contacting upper terminal pin, and a foot, said pins being held intact by bias forces which maintain the contacts surfaces together but in a slideable relationship to each other. There may also be an elastomeric material of predetermined height when in an uncompressed state, said material surrounding the pins to create said bias force and maintain the surface in slideable electrical contact. There may also be a rigid top surface located atop said elastomeric material, said up-stop surface including at least one aperture to receive a portion of said longitudinal extension and at least on channel, having an up-stop wall and a recess to receive and contact said at least one flange or other contact surface on the pin, said channel being sized to be large enough to receive said flanges with minimum frictional contact the sidewalls; so that said up-stop surface provides an upward stop limit for the upper pin by virtue of its contact with the flanges. The channel may be a depression, recess or upstanding walls which have a similar confining effect.

The up-stop surface is fixed in position at a predetermined distance above said foot or other bottom boundary layer, said distance being less than the height of the uncompressed elastomeric material plus the height of at least one of the flanges, so that the elastomeric material is in a precompressed condition before the upper pin comes in contact with the IC pad. The predetermined location for the up-stop surface provides a precision datum when used in conjunction with the lateral flange element of the upper terminal pin. This pre-compressed condition provides a loading force for the upper terminal pin against the precision up-stop surface. Furthermore, the pre-compressed condition also provides a more uniform bias force against the pins as they contact the IC pads. Without precompression, the initial travel of the pins would have a lower responsive force than the later travel as the elastomer compresses further.

Also disclosed is a contact pin array assembly for making temporary contact of test pad on a wafer level integrated circuit device having an upper contact pin, configured to move downwardly along a Z-axis when in contact with said pads, the pin having longitudinal upper portion, having a tip and a bottom end a pair of laterally extending flanges (or other stop engagement members), having a predetermined width and an upper edge, said flanges extending from said bottom end of said upper portion. There may also be a lower portion extending said flanges, a lower pin in slideable contact with the upper pin at said lower portion and an up-stop plate being rigid plate of a substantially non-hydroscopic material with a low coefficient of expansion. The up stop plate has a bottom (or other contact) surface including a plurality of spaced part, parallel recesses sized to just receive said flanges with minimal frictional contact, and to confine said flanges in a predetermined orientation, at least one upper edge of said flanges contacting said bottom surface of the said plate to define an upper travel limit for said pin; so that the pins are confined against rotational movement and have an upper travel limit defined by said plate thereby keeping said pins aligned in all axes while permitting movement along the Z-axis. The pin travel is preferably limited so that said flange never fully exits the channel Also disclosed is a method of providing a plurality of coplanar contact pin crowns to test pads on a wafer level integrated circuit, having all for some of the steps, in any order, of forming a top plate, hereafter referred to as pin guide, with apertures for said pins, so that said crowns protrude from said apertures; forming a stop element on each pin; forming an up-stop portion on the underside of said top plate; configuring each pin to engage between the stop element and up-stop to limit upward Z-axis travel of the pin; forming a channel in the underside of the top plate, said channel being sized to receive a portion of the pin so that rotation of the pin in the channel is restricted so that the Z-axis upper travel limit of the pins are limited by the up-stop contact. The pin travel is limited so that said flange never fully exits the channel The pin guide plate may be fabricated by either machining or molding processes and may be preferably composed of a ceramic material or glass filled composite.

As disclosed this is a method of providing an uniform resilient upward bias force on a plurality of contact pin against test pads on a wafer level integrated having all or some of the steps, in any order, of, inserting an upper pin having a wedged contact surface into an elastomer block, inserting a bottom pin having a wedge contact surface in contact with the wedged surface of the upper pin within said elastomeric block, and pre-compressing said block a predetermined amount by confining the block between upper and lower plates. The pre-compression can be accomplished in various ways but the primary effect is to get a uniform z-axis resilience in response to pin contact with the IC pads. Without pre-compression, the resilient force is highly non uniform due to the 'slack' in the elastomer in its initial compression. Also disclosed is a method of precisely aligning a pin guide plate having corners within a retainer plate having like corners and sized to receive said pin guide plate, for use an integrated circuit testing apparatus, comprising any or all of the following steps in any order:
  a. accurately locating a registration corner and adjacent sidewalls of said retainer plate and said pin guide plate,
  b. loosely inserting said pin guide into said retainer,
  c. Inserting bias elements in the sidewalls of at least a diagonally adjacent corner to said one corner and biasing said pin guide into and said registration corner, so that the pin guide is aligned into said registration corner.

The method can also include inserting bias elements in to at least two corners.

The method can also include inserting bias element into all corners aside from the registration corner.

The method can also include cutting away or forming the registration corner or the corner on the pin guide (or both) so that the corners themselves do not touch or meet but that their sidewalls extending away from the corners will precisely engage. This avoids the problem that the corners are slightly mismatched and prevent proper engagement of the sidewalls for alignment since it is easier to machine accurate sidewalls than corners.

The disclosure also includes an alignment system for precision alignment of test pins in an integrated circuit tester comprising any or all of the following elements:
  a. pin guide plate, having at least two corners, one of said corners being the registration corner and the other being the driven corner, said corners having sidewall extending therefrom;
  b. a retainer plate for receiving said guide plate, said retainer having a aperture generally sized to receive said guide plate and likewise having at least two corners; said retainer including sidewalls extending away from said corners, one of said corners being a registration corner and defining, together with the guide plate, the precision location for the test pins; the other of said corners being the driving corner;
  c. said sidewalls of said driving corner including recesses therein;
  d. said sidewalls of said driven corner of said guide plate including recesses;
  e. elastomeric material fitted in said driving and driven recesses for biasing the pin guide plate from the driven corner into the registration corner of said retainer plate, so that the guild plate is precision registered with the retainer by virtue of the mating of registration corners under bias force.

The alignment system may also include the radius of said driven corner being enlarged so that when said pin guide corner is inserted therein, contact is substantially made between sidewalls.

The alignment system may also include the radius of said driving corner being decreased so that when said pin guide corner is inserted therein, contact is substantially made between sidewalls.

The alignment system may also include the use of cylindrical elastomers as bias elements.

BRIEF DESCRIPTION OF THE DRAWINGS

FIGS. 24a-f are views of an individual upper pin with double edge crown and recess in the following views: a: top plan, b: side plan, c: front plan, d: other side plan, e: side perspective, f: bottom plan.

FIGS. 26a-f are views of an individual upper pin with a 4 point crown with central recess in the following views: a: top plan, b: side plan, c: front plan, d: other side plan, e: side perspective, f: bottom plan.

FIGS. 27a-f are views of an individual upper pin with a wedge crown in the following views: a: top plan, b: side plan, c: front plan, d: other side plan, e: side perspective, f: bottom plan.

FIGS. 28a-f are views of an individual upper pin with a chisel crown in the following views: a: top plan, b: side plan, c: front plan, d: other side plan, e: side perspective, f: bottom plan.

FIGS. 29a-f are views of an individual upper pin with a double chisel crown in the following views: a: top plan, b: side plan, c: front plan, d: other side plan, e: side perspective, f: bottom plan.

DETAILED DESCRIPTION OF THE DISCLOSURE

A typical IC wafer contains between 1 k-22 k dies typically organized in a regular matrix separated by horizontal and vertical scribe lines, for later cutting into individual dies or chips to be mounted in an IC enclosure with leads or contacts. This disclosure is primarily directed to testing of an individual dies or groups of dies in an array such as a pattern of generally geographically adjacent dies, or multiple arrays simultaneously, before they are cut along the scribe lines, whereafter, each die is inserted into an IC package with leads or contacts.

Figure 1:
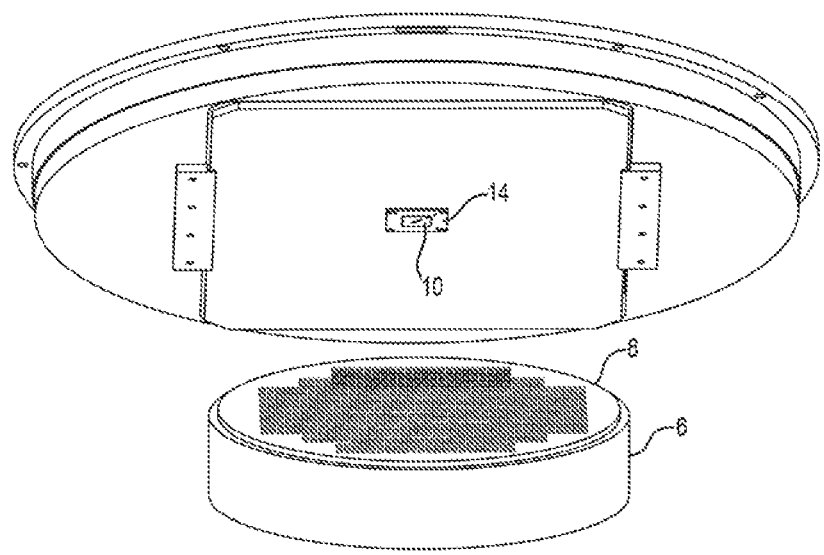
FIG. 1 is a schematic view of a subset of components of a wafer prober system and a wafer.
Figure 2:
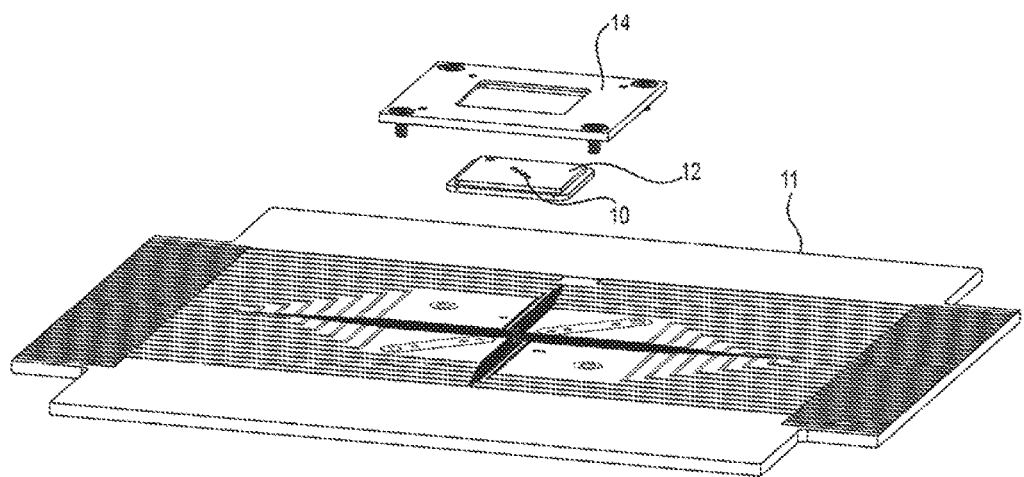
FIG. 2 is a schematic view of a probe array as affixed to a probe card Printed Circuit Board (PCB) said assembly also commonly referred to as probe card.

In the preferred embodiment, as shown in FIGS. 1 and 2, a probe array of contacts 10 is held, preferably close press fit registration to prevent movement, into a pin guide plate/pin guide 12 which itself is affixed onto probe card plate 14 by means of a retainer. Said retainer may include a picture frame opening which has a stepped ledge to accommodate a like ledge on the pin guide plate 12. It is preferable to restrict freedom of lateral movement by means of alignment pins press fit into retainer to secure registration relative to the probe card or PCB. This retainer may be fastened to the probe card via screw fasteners or the like.

The pin guide plate 12 abuts the PCB probe card 11 when assembled. The preferred material for the plate is a machineable ceramic such as Macor® or Photoveel® but Torlon® or other composite may be used alternatively. The PCB board includes a plurality of traces which connect signal lines from the probe array to connectors for the Test systems. Probe card plate/retainer 14 comprised of PCB, retainer and probe array is mounted in a "wafer prober" (not shown) which is a robotic machine which holds the probe cards and the wafer 8, atop a chuck 6 and preferably moves the wafer into position and then in contact with the plate guide 12. Alternatively, the plate could be moved and the wafer immobilized, but this is uncommon with current wafer prober systems. The wafer prober robot is well known in the art and sold by companies such as TEL (Tokio Electron) TSK Solutions/Accretech, and Electroglass (EG). Prior art probe arrays were constructed using micro spring pins, buckling beams and cantilevered structures, all of which suffered from poor performance particularly at higher frequencies, where their capacitance and inductance were limiters.

The prober robot locates the position of the array by a known camera system which locates fiducial markings on the pins of the array and brings the wafer into contact with selected pins for testing, as will be explained herein. The camera system typically includes an upwardly and downwardly pointing camera, one for calibrating location on the wafer and the other to calibrate on the pin array. Once calibrated, the movement of both/either is tracked and the prober should know the exact number of steps to each die on the wafer.

Figure 3:
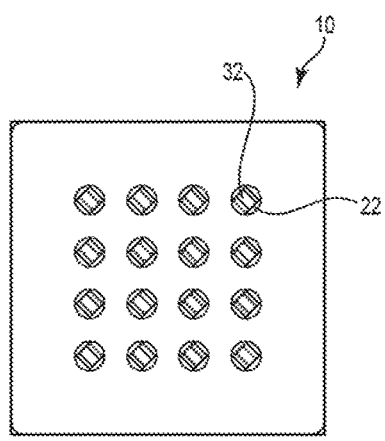
FIG. 3 is a top plan view of a probe array.
Figure 4:
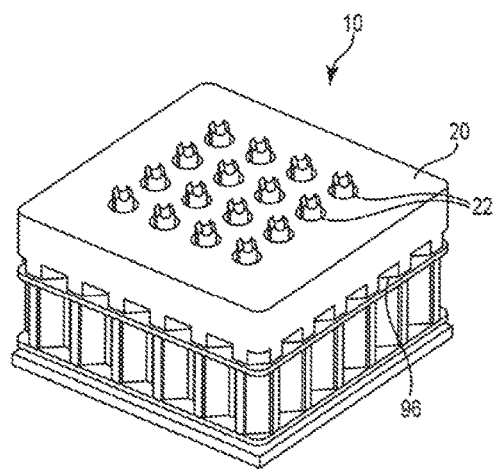
FIG. 4 is an isometric view of the probe array in FIG. 2.
Figure 13:
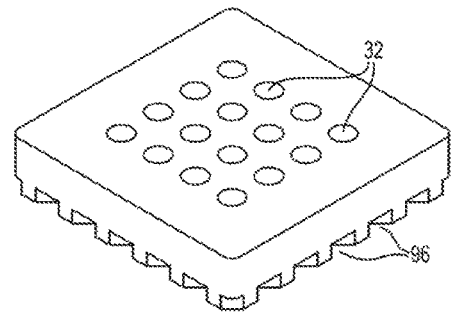
FIG. 13 is a view like FIG. 10 with the pins removed.
Figure 14:
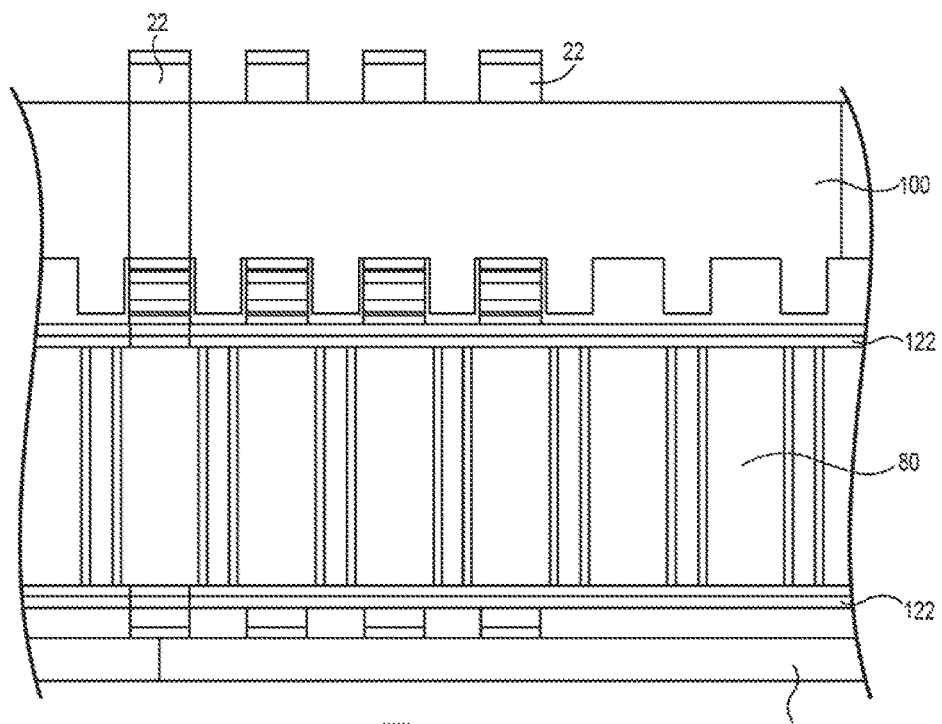
FIG. 14 is a side view of the array of FIG. 3 with portions broken away.

An array 10 is a package of contact pins 22/62 which form apart of a multi-layer package. This package 10 has a pin guide plate 20 with a plurality of apertures 22 through which the upper portion of probe pins 30 protruding, as shown in FIGS. 3-4. In FIGS. 13-14, it can be seen that the preferred construction of the apertures 32 is circular with a central portion having a being a plurality of rectangular slots or channel 96 with parallel side walls sized to receive the cross bar flange portion 44a-44b of pin 22 which have a like cross section. The resultant channel structure maintains alignment of the pins and prevents rotation thereof consequently controlling the orientation of the entire pin. Rotation is a twisting or torqueing action which would make the planar contact surfaces 52/53 (FIG. 8) no longer be coplanar and hence have less electrical contact surface in common.

Figure 5:
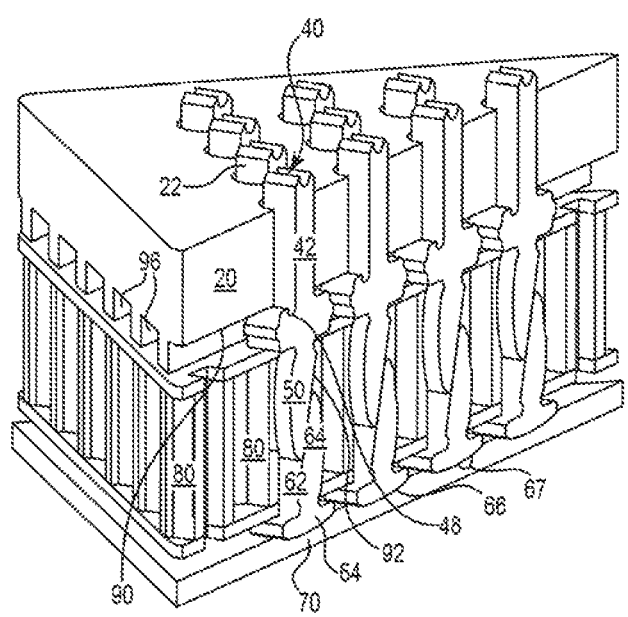
FIG. 5 is a side perspective view of the prober array in FIG. 3 with portions broken away.
Figure 6:
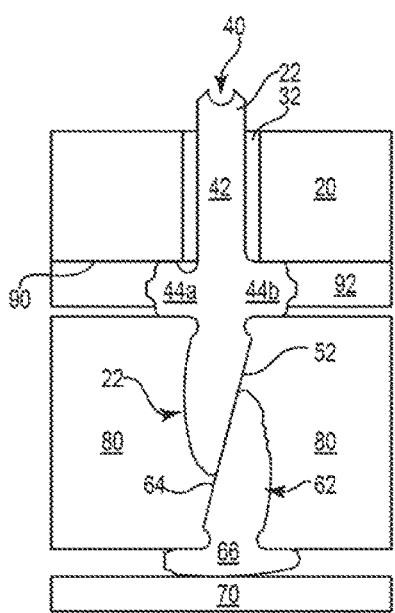
FIG. 6 is a side plan schematic view of a pair of probes in an uncompressed state.
Figure 7:
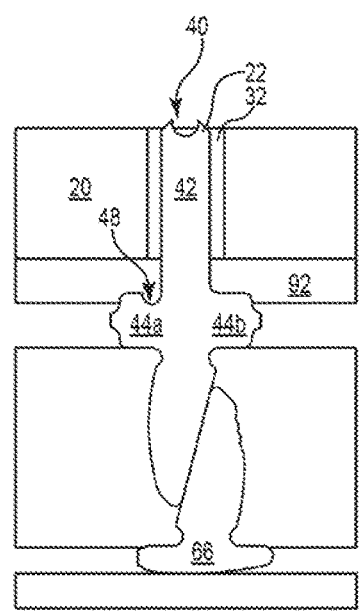
FIG. 7 is a view like FIG. 6 with the probes in a compressed state.

Upper probe portion of pins 22 can be seen more clearly in FIGS. 5-7, wherein each has a crown 40 which makes contact with the die, an elongated body 42 which preferably has, as mentioned, a rectangular cross section. Other cross sections are possible, such as oval, triangular, keyed (with a keyway), etc, if the cross sections are used to mate with a like shape in aperture 32, or a portion thereof, to maintain rotational alignment of the upper pin instead of or in addition to channels 96.

Figure 11:
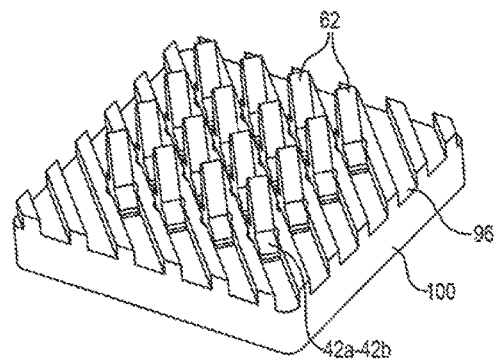
FIG. 11 is an isometric view of the bottom side of the portion of the array shown in FIG. 10.
Figure 12:
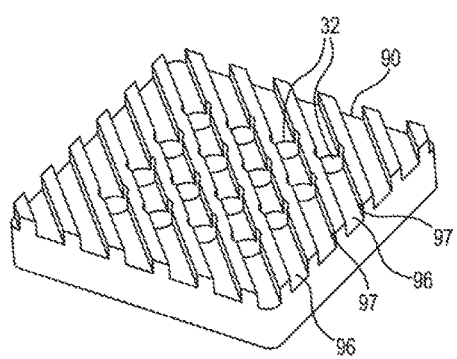
FIG. 12 is a view like FIG. 11 with pins removed.
Figure 20:
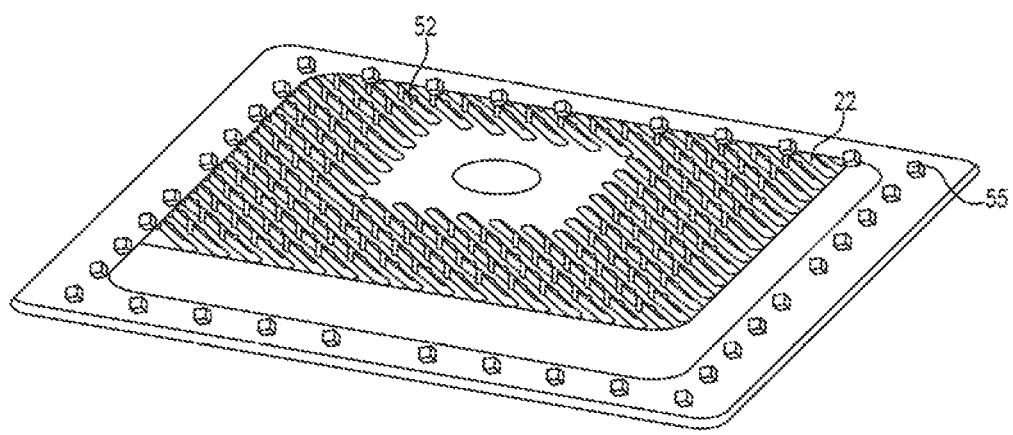
FIG. 20 is bottom isometric view of the pin guide plate with retention posts as seen from the bottom.
Figure 21:
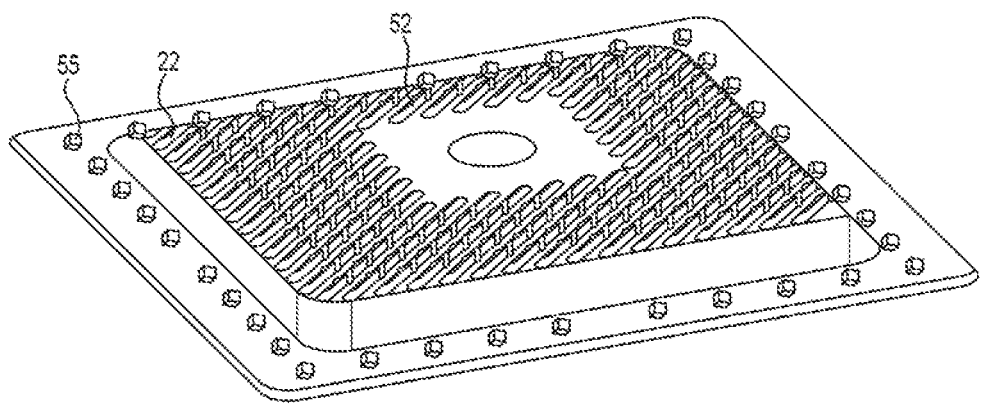
FIG. 21 is a view like FIG. 20 with the perspective rotated 180 degrees.
Figure 22:
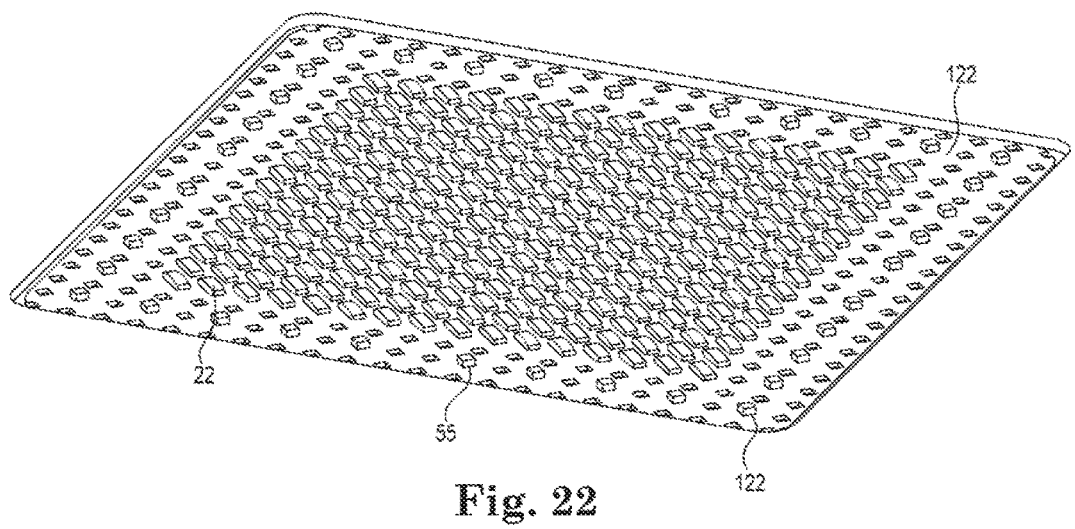
FIG. 22 is a view like FIG. 20 of the bottom of the pin guide but with a Kapton cartridge inserted over retention posts.
Figure 23:
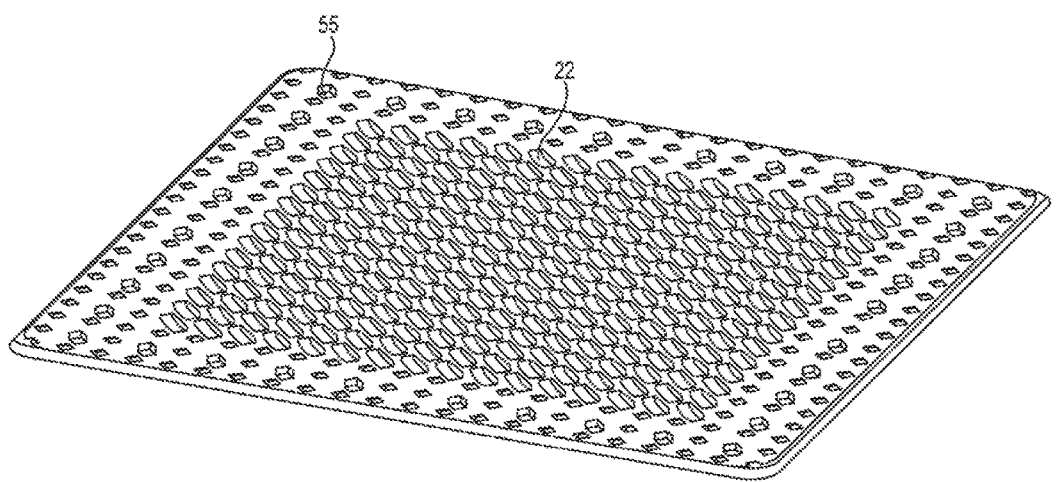
FIG. 23 is a view like FIG. 22 but rotated to a different perspective.
Figure 25A:
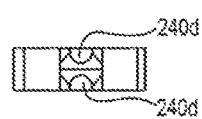
FIGS. 25a-f are views of an individual upper pin with a 4 point crown with lateral recess in the following views: a: top plan, b: side plan, c: front plan, d: other side plan, e: side perspective, f: bottom plan.
Figure 25B:
Figure 25C:
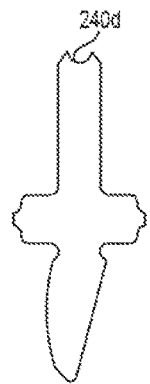
Figure 25D:
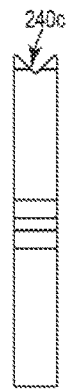
Figure 25E:
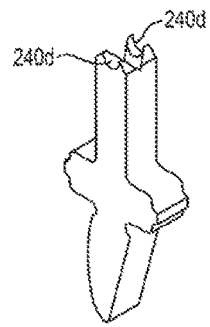
Figure 25F:
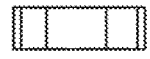

The preferred method of preventing rotation and maintaining alignment of pin 42 is accomplished by creating channels 96 in the pin guide plate 20, as can be seen most clearly in FIGS. 5, 10, 11, 12, 13, 18, 19, 20 and 21. These channels are preferably formed or cut in the material in parallel spaced apart sidewalls 97 (FIG. 12) creating recesses or depressions 96 with an aperture 32 in the channel upper interior wall to allow the passage of the upper pin portion 42. The aperture 32 may be circular or be likewise shaped with parallel spaced apart sidewalls sufficient to allow passage of portion 42, but also prevent its rotation. Since these parallel walls spaced apart sidewalls 97 already accomplish this function, one or the other may be dispensed with unless both are desired walls 97 are preferably sized to provide low resistance (and may be coated with low resistance materials such as Teflon®) by being spaced apart sufficiently to not make contact with the pin when properly oriented, but close enough that if the pin rotates, it will immediately engage the walls and be reoriented. The channels receive cross bar flanges 44a-44b and prevent their rotation or change in alignment, so that they provide good alignment with the greatest amount of contact area for the lower pin at their contact surfaces 52/64 (FIG. 6). As can be seen in FIG. 11, pins 66. FIGS. 20-22 show the top pins 22 in place from their bottom view in different perspectives. Also shown in FIGS. 20-22 are alignment posts 55 around the periphery of pin guide plate 20. Alignment posts 55 maintain alignment of various layers such as the bottom kapton layer.

At the bottom of body 42 are left and right cross bar flange sections 44a-44b one of which includes an optional recess 48 is used as a fiducial mark to help the assembler or machine which is the right or left hand side of the pin as seen from above. It may also used for alignment purposes. These flanges also operate as a key for a keyway slot in the Kapton layer 92 (see below) and in the bottom surface of the pin guide plate 20.

The cross bar flange section 44a-b provide an upper limiter for upper portion 42. In the preferred embodiment is critical that all of the crowns—40 be maintained in a very coplanar relationship to each other, preferably within 30 microns of each other. For conventional semiconductor wafer processes, the wafer test pads, bumps or balls are assumed to be likewise very planar so contact of each crown onto the wafer must be at a relatively equal pressure to prevent damage to the wafer. This is achieved by having the crowns coplanar the pin deflection pressure likewise relatively equal. For novel 3D wafer processes, there may be requirements for multiple planes at differing heights for wafer test pads, bumps or balls, but the presumption is that the planarity requirement for each plane would be likewise required to be coplanar within 30 microns.

The bottom portion 50 of the upper pin 22 is characterized by having a generally planar portion 52 which is wedge shaped to slideably engage/mate with a like planar surface 64 of lower pin 62. Surfaces 52 and 64 slide by each other during compression. Both pins are conductive and thus carry signals to the load board 70 at the rocker foot 66 of lower pin 62. The arcuate shaped based of foot 66 is preferred, though other forms such as flat or having a semi-circular or partial cylindrical protuberance 67 in the center of the foot, are possible. Foot 66 may be arcuate, either across its entire base or just a portion as shown at the hemispherical or half or partial cylindrical protrusion 67. This creates a "rocker" base which allows the foot to adapt to variations in the load/contact board. This protrusion is preferably equidistant from the ends of the base/foot or that it is central to an axis running through the midpoint or center of gravity of the pin. The semicircular shape may also be substituted with other shapes that permit a rocking action. This rocking action provides helps remove any oxide on the protrusion or the contact load board. The further advantage of having a protrusion of any shape, though preferably a partial cylinder as shown is that the force per unit area on the load board is increased thereby increasing the quality of the electrical contact with the board. The protrusion is arcuate similar to a truncated cylinder but having walls that slope generally smoothly into the remaining portion of the foot. Top plate 20 is preferably made of a ceramic material or Macor® such as SiC Technide® C18, SiN Technide® 310Shapal M Soft®, Photoveel L® (Ferrotec), Photoveel®, MM500 Mccalex®, or other materials with low expansion coefficients. Alternatively, composite materials such as Torlon 5030® may satisfy some applications with more constrained thermal or humidity exposure.

The preferred material can be predictably formed or milled to great tolerance of known thickness, very flat, and have a low coefficient of thermal expansion and be non-hydroscopic to avoid expansion due to variable weather conditions. Chip test houses where this device will be used are not always well temperature and humidity controlled, so the pin guide plate material must be sufficiently stable to deliver the pin crowns 40 in a coplanar state. Top plate 20 must also be millable or formable to have the rectangular channels 96 mentioned above.

Pins 22 and 62 are upwardly biased relative to each other by, for example, an elastomer 80 which surrounds, at least in part, the pins. This provides an upward bias against cross bar flanges 44*a*-44*b*. The lower pin is in fact driven downwardly against the load board by the same elastomer, which thereby creates a solid electrical contact therewith. Elastomer 80 may include a top and bottom layer of Kapton® or other somewhat elastic material 122 as a further means to hold the pins within the elastomer at the narrowed neck regions in the pins 54. In the preferred embodiment Kapton® layers 122 have apertures larger than the narrowed neck regions 54 of the pins but smaller than the wider portions 50, 68 so that the pins will be resiliently confined between Kapton® layers.

The upper limit of travel of the upper pin 22 in the Z-axial direction for the Z-height is defined by engagement of the up-stop surface 90 and some portion of pin 22 which engages the up-stop. In the preferred embodiment, it is cross bar flanges 44*a*-44*b*, but it could be any protrusion on the pin for this purpose. It is possible that other surfaces of pin guide plate 20 and other portions of pin 22 form the combination of an up-stop 90, 190, 390 for the upper pin. It is the top travel point for that pin. The lower surface up-stop of plate 20 is located such that the protrusion of crowns 40 will all be located in the same plane. The preferred protrusion of the crown is 75 microns.

Is it also desirable to have the upward force of pin 22 to be relatively uniform through its travel. This is achieved by pre-compression/pre-loading of the elastomer 80. In FIG. 6, pin 22 is precompressed downwardly by up-stop surface 90 of pin guide plate 20 so that when pin 22 engages the wafer and is compressed, the force response to compression is relatively uniform. If the pin was not compressed, the elastomer would exhibit a much less uniform response, with less force at the beginning of the downward pin deflection that later. The elastomer exhibits better uniformity when it is already compressed state. The preferred pre-compression is about 80 microns.

The crown or tip 40 performs several functions. First, of course, it makes electrical contact with the wafer test pad or electrode. Wafer test pad may be include the forms of metallic film, electroplated bump or solder ball. In alternate embodiments, the crown may each have Kelvin style contact (force and sense) in order to confirm a reliable test, as known in the art.

The crown also has the need to shed any debris which may accumulate between contact tests.

Finally, the crowns also need to provide fiducial recognition for the camera system in the prober which will align the array with the wafer at precise points. The camera system must be able to recognize the crown, and the center of the crown by recognizable artifacts on the crown, whether they are there for other reasons, or solely for the purpose of enhancing the reliability of recognition. For example a cross hair, such as "xx" could be placed in the base of the crown as a point of recognition. If each crown included such a marking, or if the corners of the array were so marked, or other known combination, the computer could calculate the position of the entire array. It may also be desirable to provide side illumination (ie orthogonal to the travel of the pin) to provide greater contrast to the position calibration camera of the probe, since the crown has facets which will reflect side illumination upwardly and provide a very bright spot in an otherwise dark field.

Various crown shapes are possible. FIGS. 24*a*-*f*, 25*a*-*f*, 26*a*-*f*, 27*a*-*f*, 28*a*-*f* and 29*a*-*f* illustrate several embodiments. Each embodiment is the same except for the crown 40 which varies by figure. In FIG. 24 the crown is has two parallel spaced apart ridges 240*a*-*b* formed in a chisel shape with an arcuate hemispherical valley 240*c* therebetween. In FIG. 25 crown 40 further includes a cross hemispherical valley 240*d* orthogonal to valley 240*c*, which is shown alternatively as a v-shaped valley, though it could also be hemispherical. This creates 4 points on the crown. FIG. 26 is similar to FIG. 25 except that all valleys 250*e*-*f* are v-shaped created sharp flat walled facets from the crown points. In FIG. 27 the crown is a chisel shape with a single flat sloped wall 240*g* creating a wedged crown. In FIG. 28 the crown is a double chisel with converging flat sidewalls 240*h*-*i*. In FIG. 29, the crown is inverted from FIG. 28 where the sidewalls 240*j*-*k* slope inwardly toward a bottom valley line.

Interposed between the pin guide top plate 20 and the elastomer 80 is a retaining layer 122 preferably of Kapton® polyamide film from Dupont or equivalent. This layer maintains the pins in place before the top surface is applied.

FIG. 11 illustrates the upper portion of the array 10 with cross bar flanges 44*a*-44*b* sitting in the channels 96. The lower pins 62 could also be sitting a like plate with channels, but this is typically not necessary.

Figure 15:
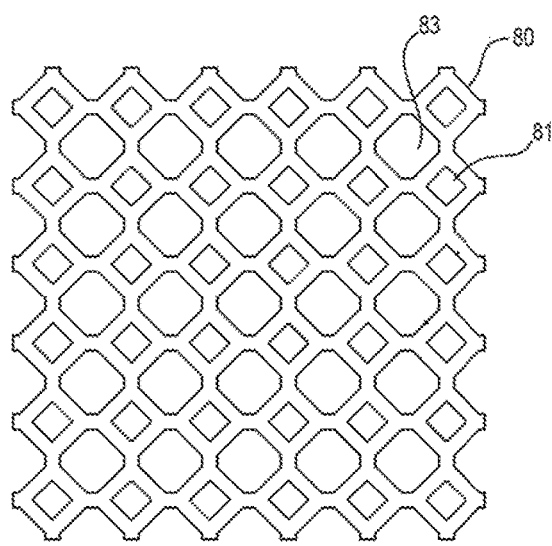
FIG. 15 is a top plan view of the elastomer layer.
Figure 16:
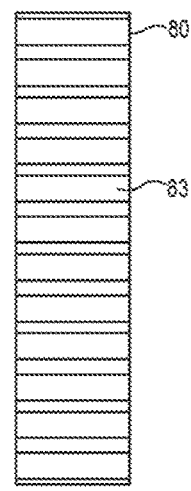
FIG. 16 is a side view of the elastomer layer.
Figure 17:
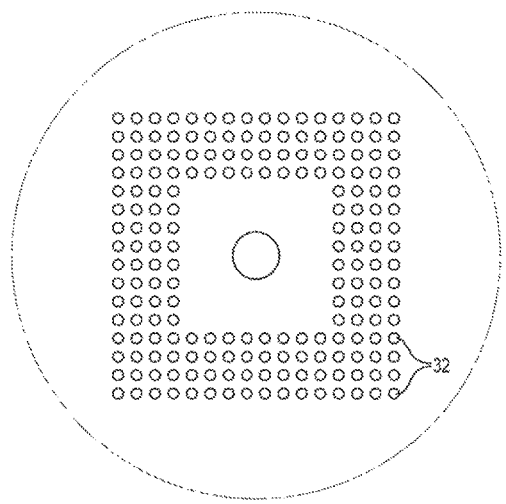
FIG. 17 is a top plan view of a top ceramic plate.
Figure 18:
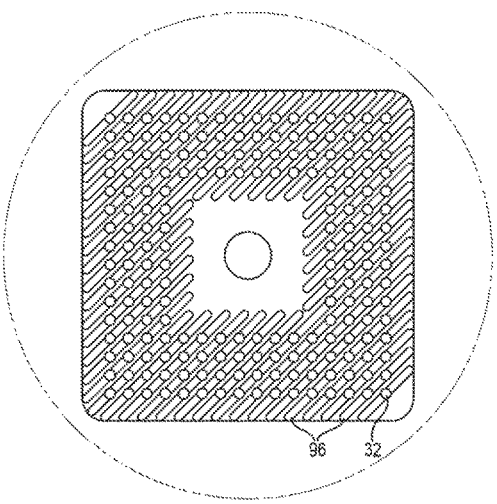
FIG. 18 is a bottom plan view of the plate in FIG. 17.
Figure 19:
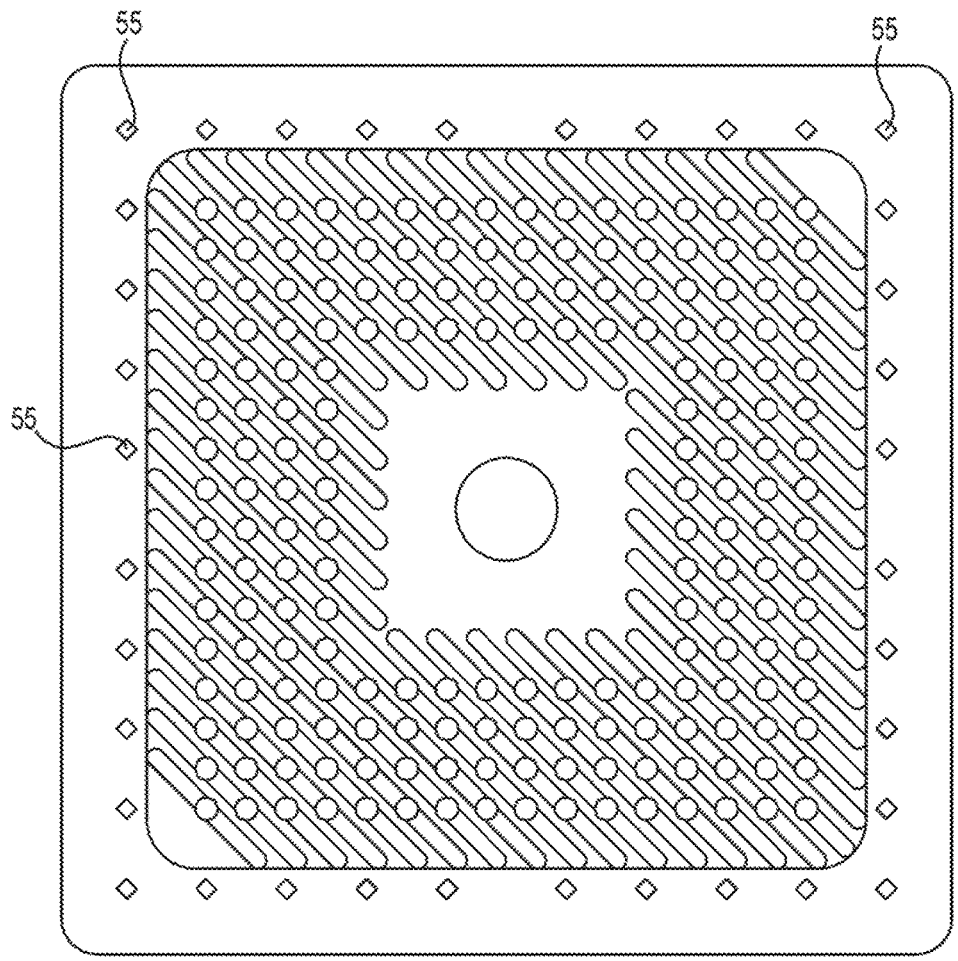
FIG. 19 is a bottom plan view like FIG. 18 except shown retention posts.

Both upper and lower pings 22 and 62 are at least in part potted into elastomer 80 which is shown in further detail in FIG. 15. The pins are placed in the space voids 81 while the octagonal voids 83 provide take up space to be used during compression and precompression. Without space, the elastomer would have a less uniform resistance/response to compression because the compressed elastomer would have no place to go. Voids 81 are typically square or rectangular, and of smaller than the cross section of that portion of the pin 50, 68 which is captured therein. This provides a bias force which maintains contact surfaces 52, 64 in planar registration for maximum electrical surface contact.

Figure 8:
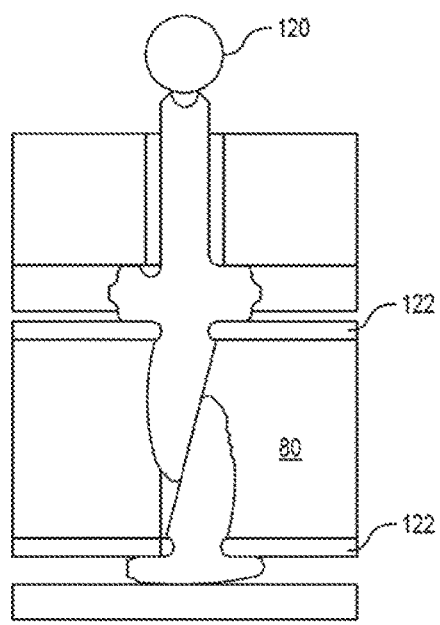
FIG. 8 is a side plan schematic view like FIG. 6 but with a contact ball illustrated and additional layers shown.
Figure 9:
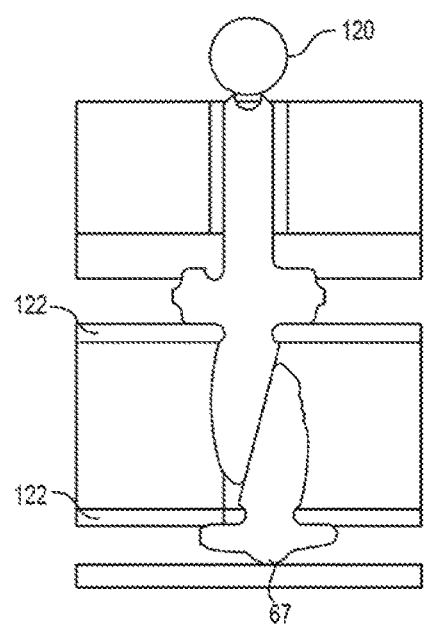
FIG. 9 is a view like FIG. 8 except with the pin shown in a compressed state.
Figure 10:
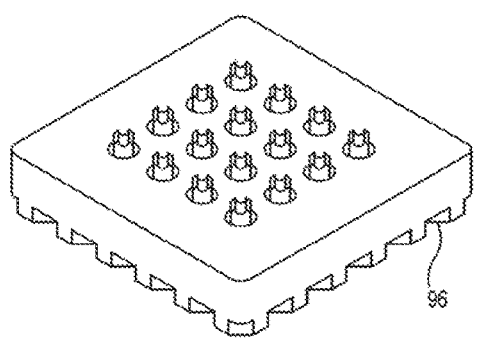
FIG. 10 is an isometric view of the top portion of the array shown in FIG. 3.

FIGS. 8 and 9 are similar to FIGS. 6 and 7 except that they include ball/pad 120 in contact with crown 40. In addition they also show a Kapton® layer 122 on both the upper and lower surfaces of the elastomeric layer 80. This layer 122 includes apertures (not shown) large enough to permit insertion of the portion of the pin shown.

Figure 30:
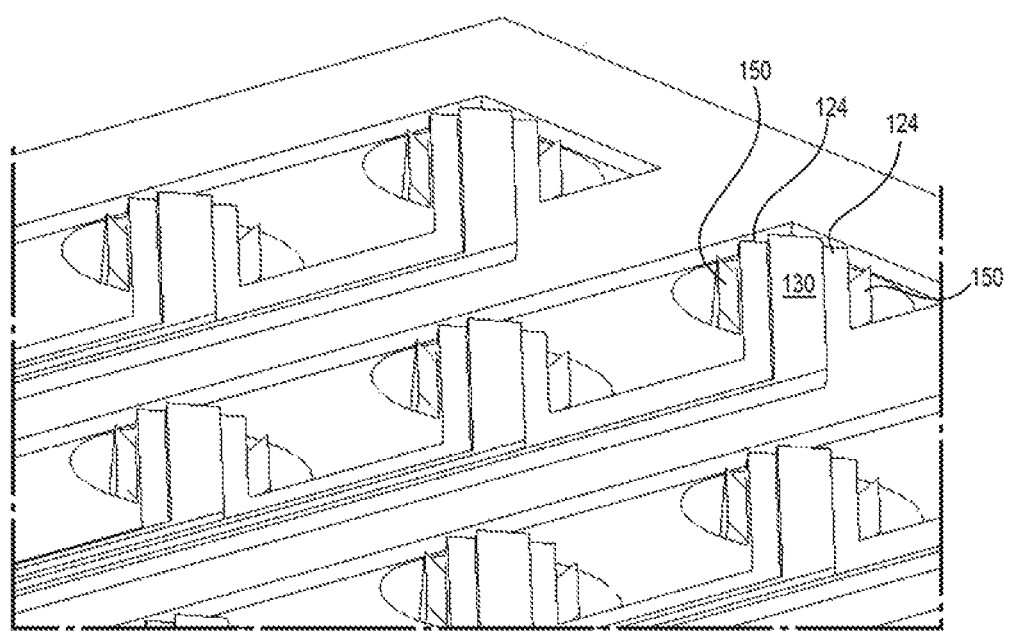
FIG. 30 is perspective view of probe tips/crowns overlayed with an example Kelvin contact system.
Figure 31:
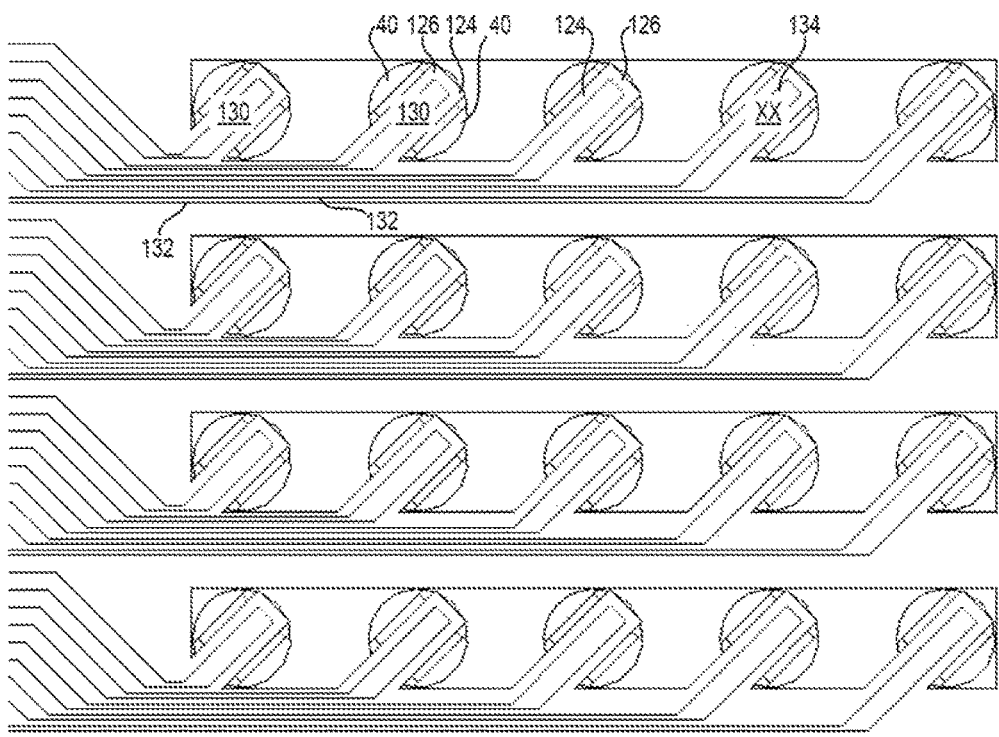
FIG. 31 is a top plan view of the probe tips overlayed with an example Kelvin contact system.
Figure 32:
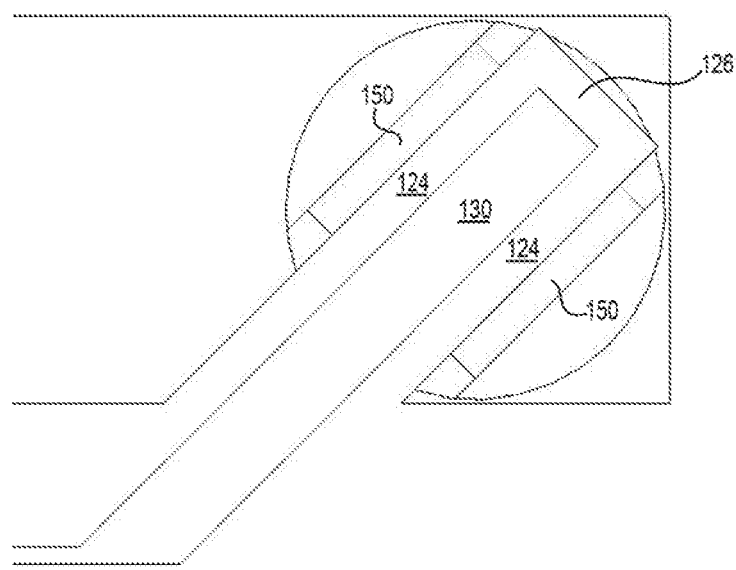
FIG. 32 is a close of up of one Kelvin contact system in FIG. 31.

FIGS. 30, 31 and 32 are views of the array in FIG. 4 but also including circuitry for Kelvin contacts. Kelvin sensing circuits are known in the art and provide a way to minimize test errors. They require additional contacts to make several points of contact on each pad, isolated, mechanically independent probes which are very small and closely spaced.

In FIG. 31, crown 40 is a wedge structure with two longitudinal ridges separated by a recess or valley. Placed within the valley is a polyamide or other insulator 124 which sits in and straddles the recess between peak pin contacts 150*a*-*b* which in this case are inverse wedge shaped per FIGS. 29*a*-*f*. The sidewalls of the peaks 150*a*-*b* cradle the Kelvin insulator 124 and provide sufficient to support for the insulator to keep relatively coplanar with peaks 150*a*-*b*. It is also possible that only the distal end 126 of the insulator is supported by a portion of the crown. Applied atop of the insulator is a conductive trace 130 which supplies the other conductor in the Kelvin circuit (typically the sense lead, with the force conductor being the crown ridges). This conductive trace run back from each of the crowns along leads 132 to the Kelvin circuitry. Because the Kelvin trace occludes the recess in the crown, any fiducial marking in the crown is unavailable to the camera system. Thus the fiducial mark may be placed on the trace or insulator as identified with "xx" at 134.

Figure 35:
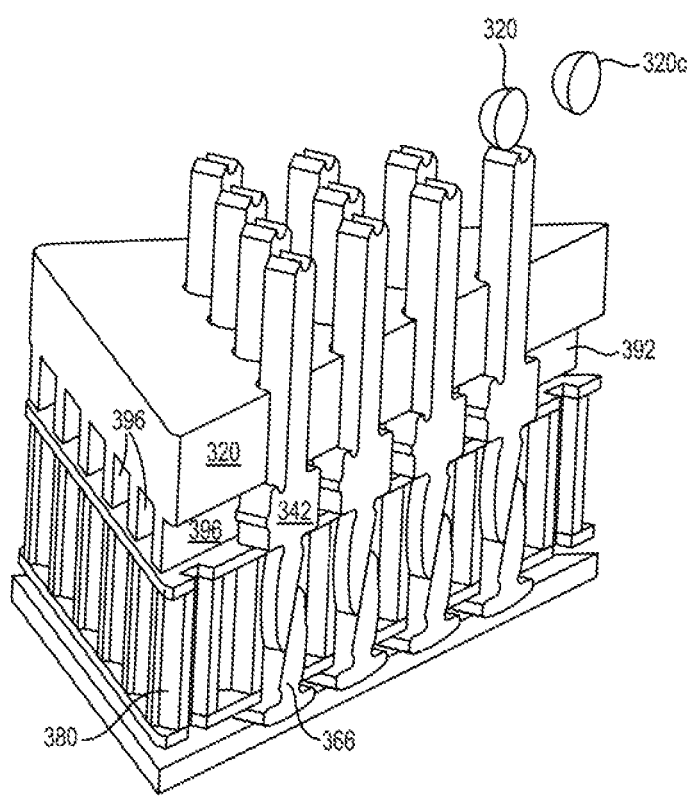
FIG. 35. is a perspective view like FIG. 33 but of an alternate embodiment with long pins.

An alternative embodiment is shown is FIGS. 35-36.

Figure 33:
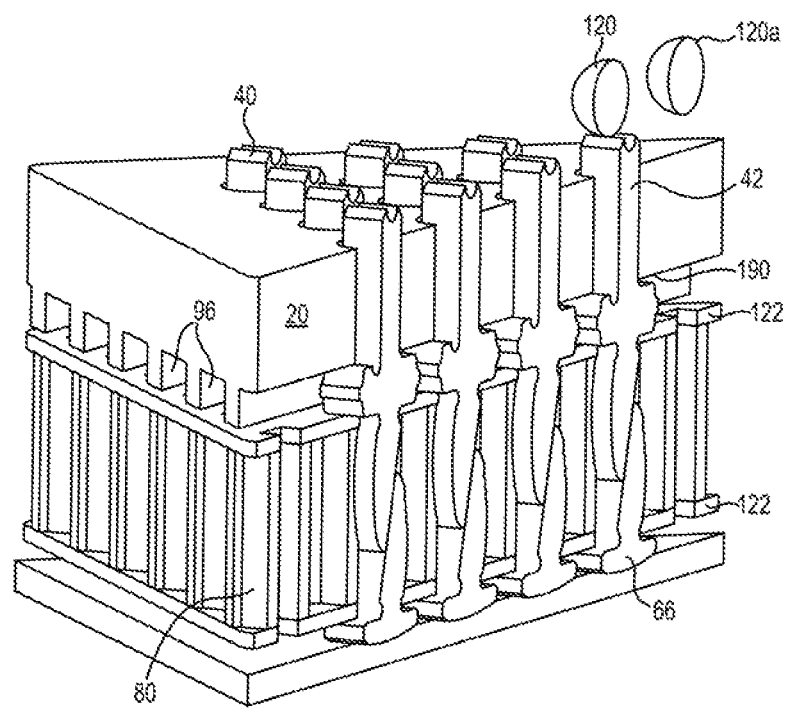
FIG. 33 is a perspective view of a pin array.
Figure 34A:
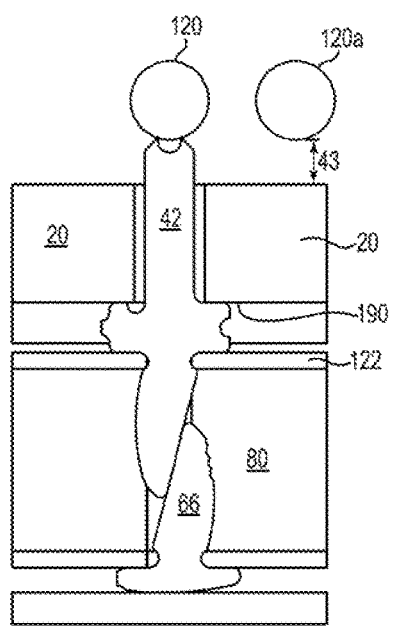
FIG. 34a and FIG. 34b are side plan views like FIGS. 5 and 6 showing a ball contact of a DUT in initial engagement (34a) and final engagement (34b) with the pin fully downwardly depressed.
Figure 34B:
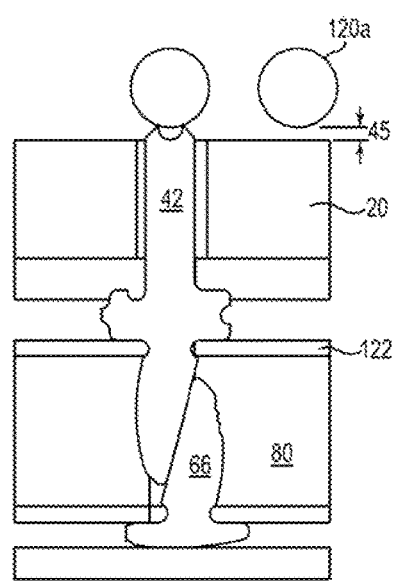

In the previous embodiment, as shown in FIGS. 33-34, pins 42 and 66 as previously described (see FIGS. 6-9). Contact balls/pads 120 are shown in cross section. At the point where the top of pin 42 first engages ball 120 (FIG. 34*a*), there is a large gap 43 between an adjacent ball 120*a* and the surface of plate 20. If however ball 120*a* is misshaped, or is a "double ball" (defect) there is a chance that the gap 45 will be nonexistent and ball 120*a* will physically strike the surface of plate 20 potentially causing damage. Note that "ball' need not be round, but means any protruding contact surface on a DUT. To avoid these consequences if defective ball shapes or heights, the embodiment in FIGS. 35-36 account for this.

To the extent the elements from one embodiment to the other are similar, the numerical designation has been designated with 300 series numbers, i.e. 42 is similar to 342. A solution to the problem set forth above, is to increase the length of that portion 410 of pin 342 which extends above plate 20 when the DUT is in test position (i.e. pin 342 is maximally displaced as show). The pin travel distance (stroke) is defined as the distance the upper pin travels between in-test and out of test positions. The pin travel is preferably limited so that the flanges never leave the channel in the prior embodiment, it was desirable, for many reasons, to have the portion of pine 42 which extended beyond surface 20 as small as possible. As can be seen in FIG. 7, the exposed portion of the pin in test mode, is virtually flat with surface 20 whereas in FIGS. 35-36 the pin height in test position 410 is substantially greater, at least sufficient to prevent ball 320*a* from contacting the surface of 20 even if it is a double height ball, a 1.5 height ball or other misshaped form. In non-test mode the pin height above plate 20 is indicated as 412. Thus in this embodiment, the pin height in test position is sufficient that another ball, typically an adjacent ball will not touch the surface of plate 20. One such limit would be that the pin apex is never lower than 50% or 10-50%, of the height of a contact ball, or just sufficient that any ball contact will not contact the surface regardless of its height.

Figure 36A:
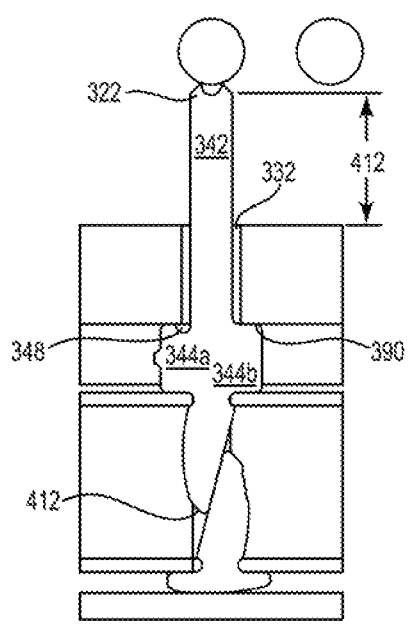
FIG. 36a and FIG. 36b are side plan views of the alternate embodiment in FIG. 35 with long pins, showing a ball contact of a DUT in initial engagement (36a) and final engagement (36b) with the pin fully downwardly depressed.
Figure 36B:
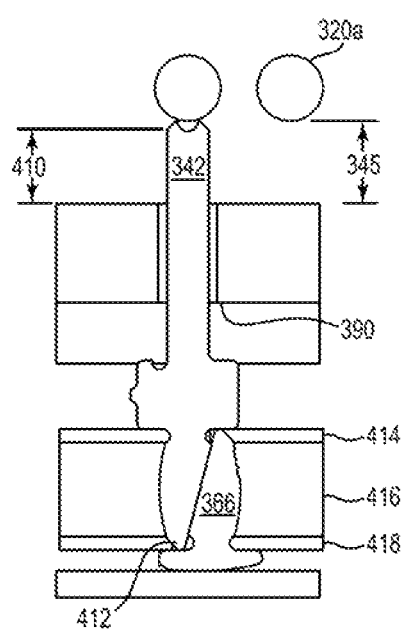

In the preferred embodiment, the travel of pin 342 is greater than pin 42. When FIGS. 7 and 36*a* are compared the distal tail 412 may be allowed to travel up to but preferably not touching the foot of pin 366. The actual downward pin travel is preferably controlled by the prober which puts the wafer into the test socket. As the pins are driven toward each other, if the proper fails, there are several possible hard stops in the system where are preferably not needed. For example contact between the lower portion of cross bar flanges 344*b* with the proximal end of pin 366 but also the distal end of pin 342 against the foot of pin 366 as shown in FIG. 36*b*. The elastomer in this configuration is shown in the preferred embodiment which has two thinner layers of less resilient elastomer 414, 418 surrounding a more elastic layer 416 which provides most of the bias force against the pins. Thus if the upper pin were to bottom out, at 412, the lower layer 418 would separate the pins from contact because the distal end of pin 342 will remain as an interposer.

The consequence of allowing this additional travel is that the elongated lateral portion 342 of the pin are taller than in the previous embodiment and alignment channels 396 are deeper. Specifically the depth of channel groves 396 must be equal to or greater than the differential between the exposed height of the pin when the pin is in test and non-test positions (i.e. 412 less 410). In the preferred embodiment the height of cross bar flange 344*a* be must be likewise equal to or greater than that differential to maintain the keying effect of channels 396. Whether by the above formula or otherwise, it is preferable that the lateral alignment portion 342 must stay at least partially engaged with the channels 396 during the entire pin travel to keep the pin grooved against rotation.

Further details of the structure for insertion of the guide plate 12 into the probe card plate or retainer 14 follows and is shown in FIGS. 37-43.

Registration of the retain 14 with guide plate 12 is important for the prober to know where exactly the pin arrange is located relative to the IC. Since the dimensions are very small, a solution in this disclosure is to insure that the guide plate, which has many probe arrays is reliably aligned with the probe card plate.

Instead of trying to align the guide plate with every corner of the probe card plate, which is extremely difficult, it is possible to align along two (or three) edges thereof and bias the guide plate into reliable position with respect to those two (or three) edges. This is much more predictable than trying to align against 4 edges.

Figure 37:
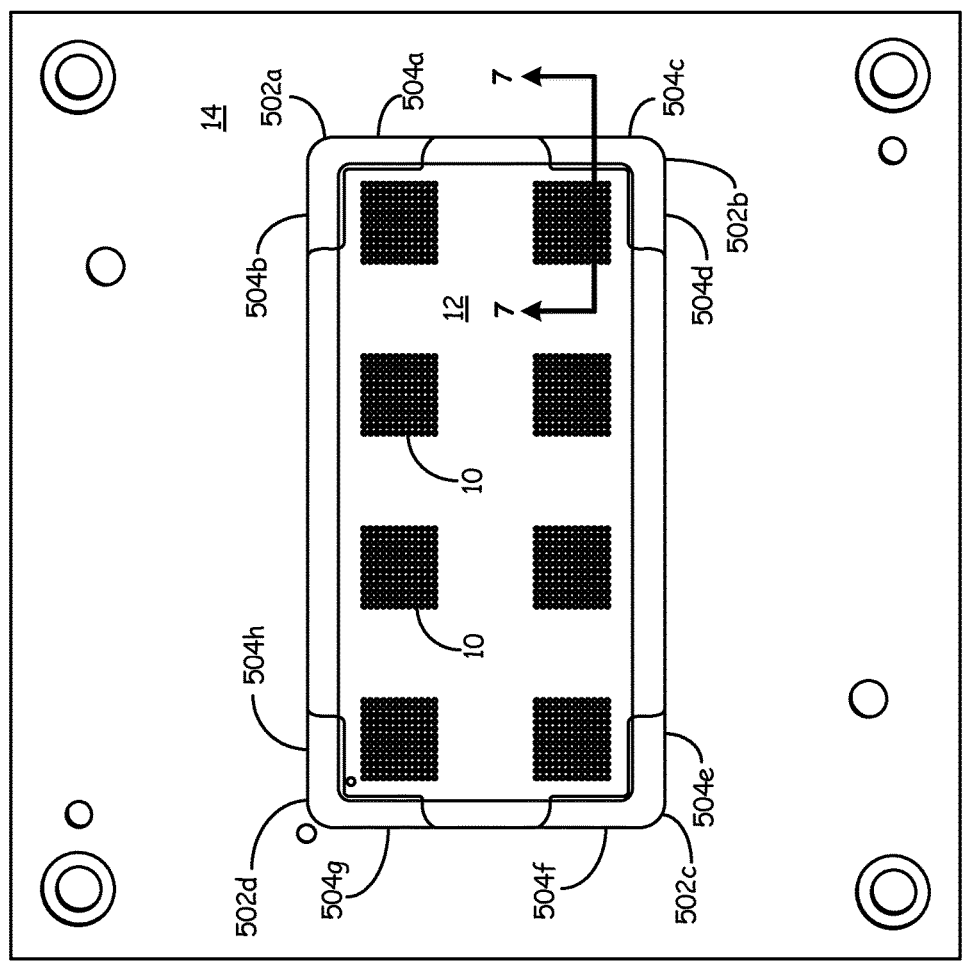
FIG. 37 is a top plan view of a probe card plate, guide plate/pin guide and pin arrays.
Figure 38:
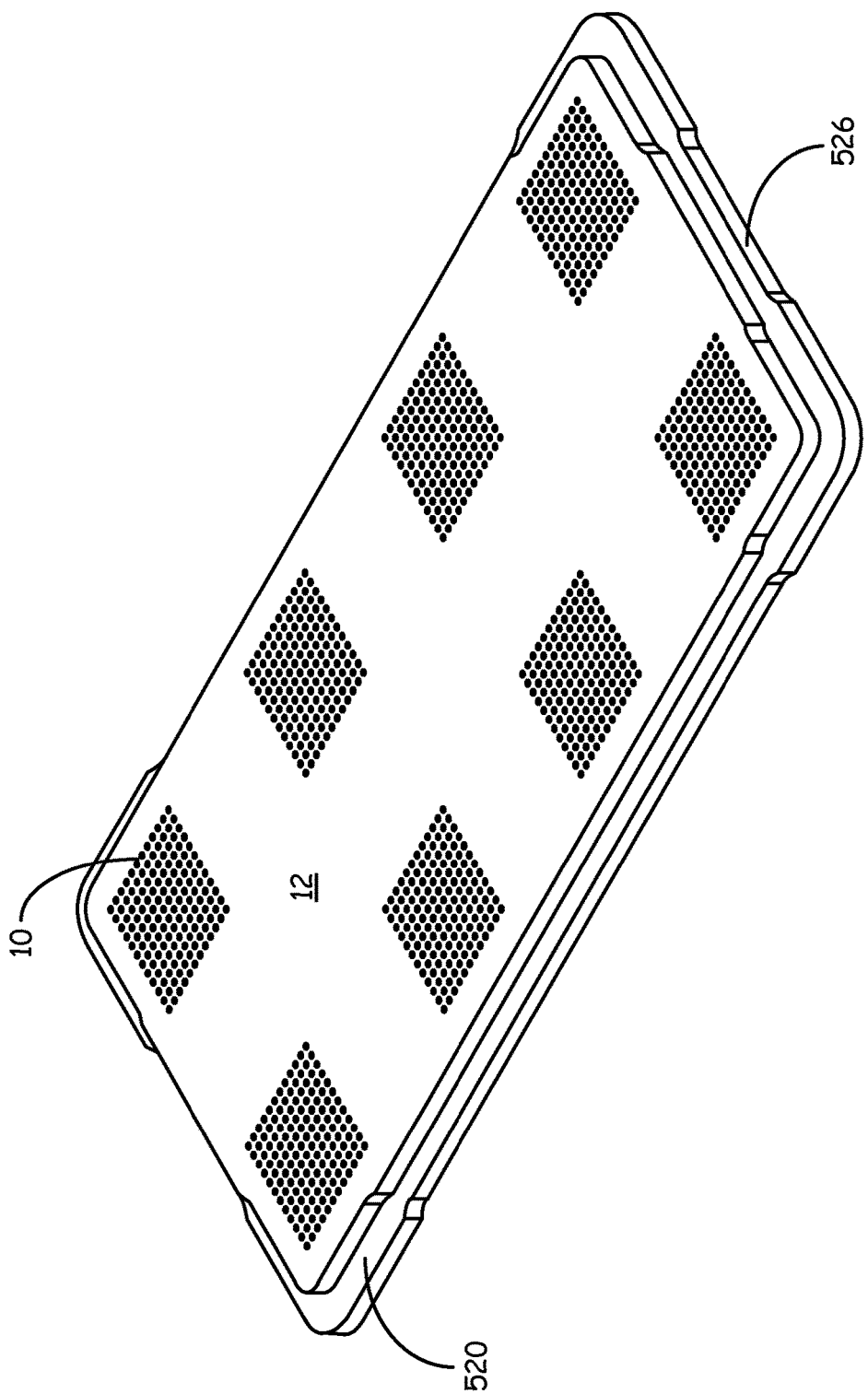
FIG. 38 is a top perspective view of the guide plate/pin guide and arrays of FIG. 37.
Figure 39:
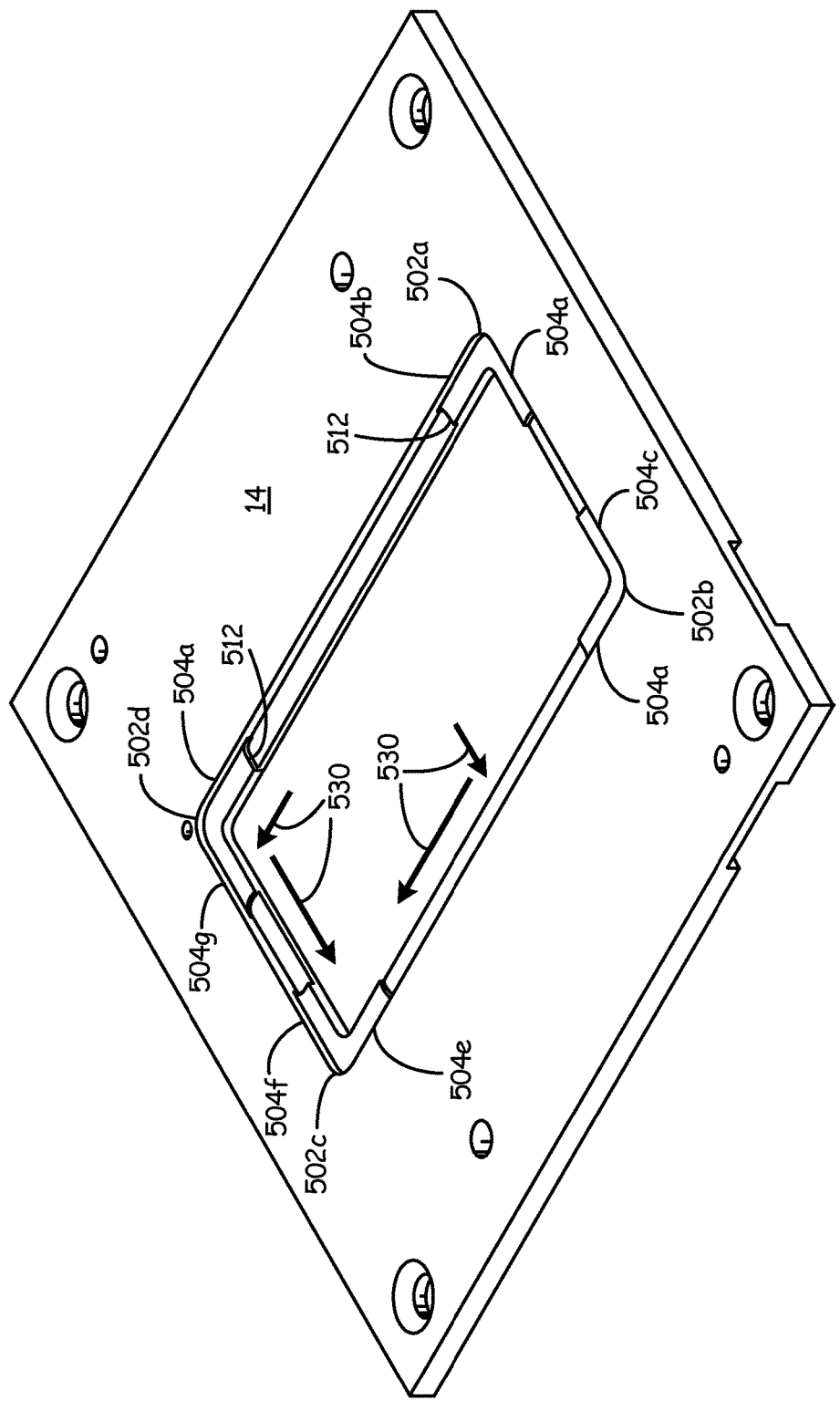
FIG. 39 is a top perspective view of the probe card plate/retainer of FIG. 37
Figure 40:
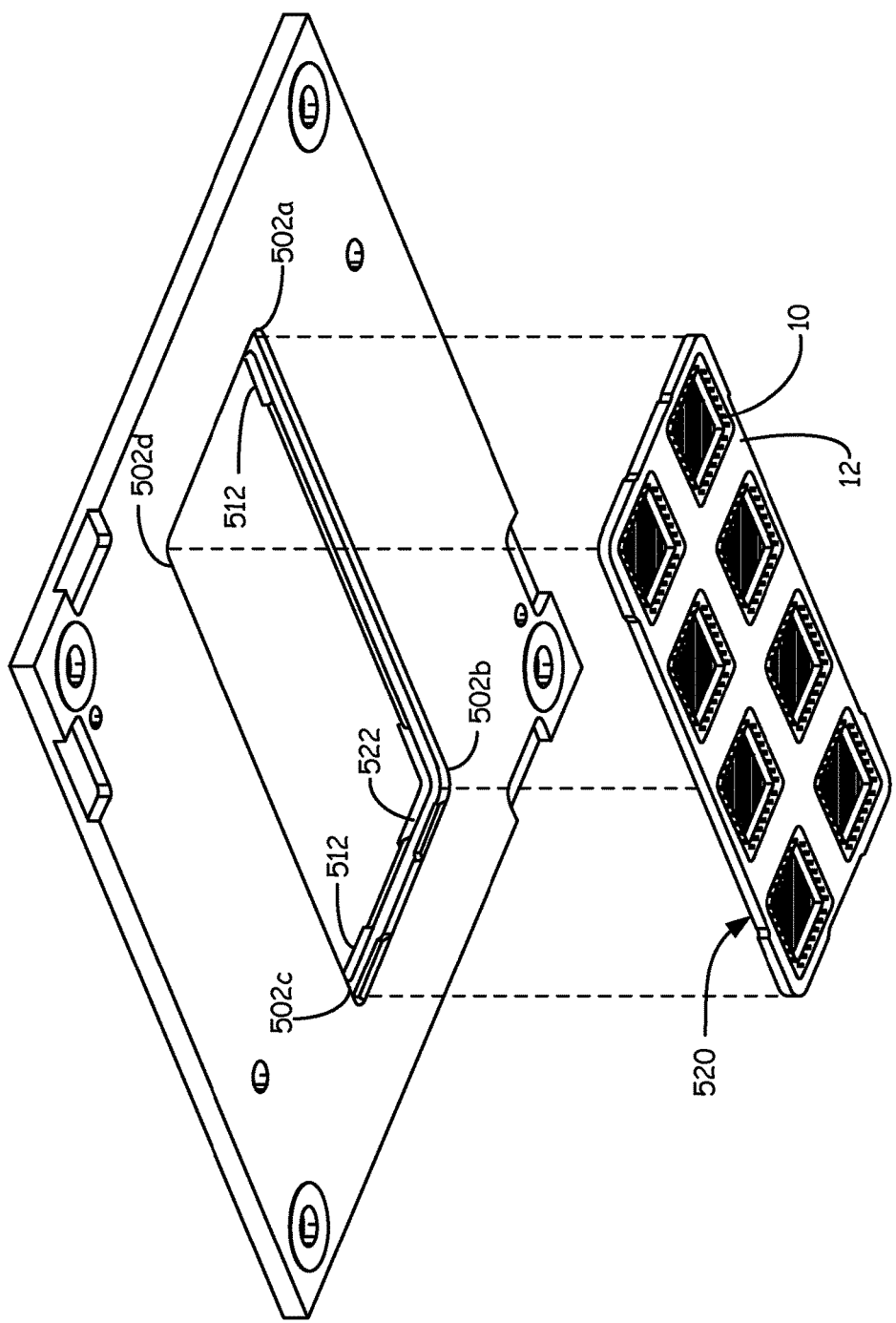
FIG. 40 is an exploded bottom perspective of the combination of FIGS. 38 and 39.
Figure 41:
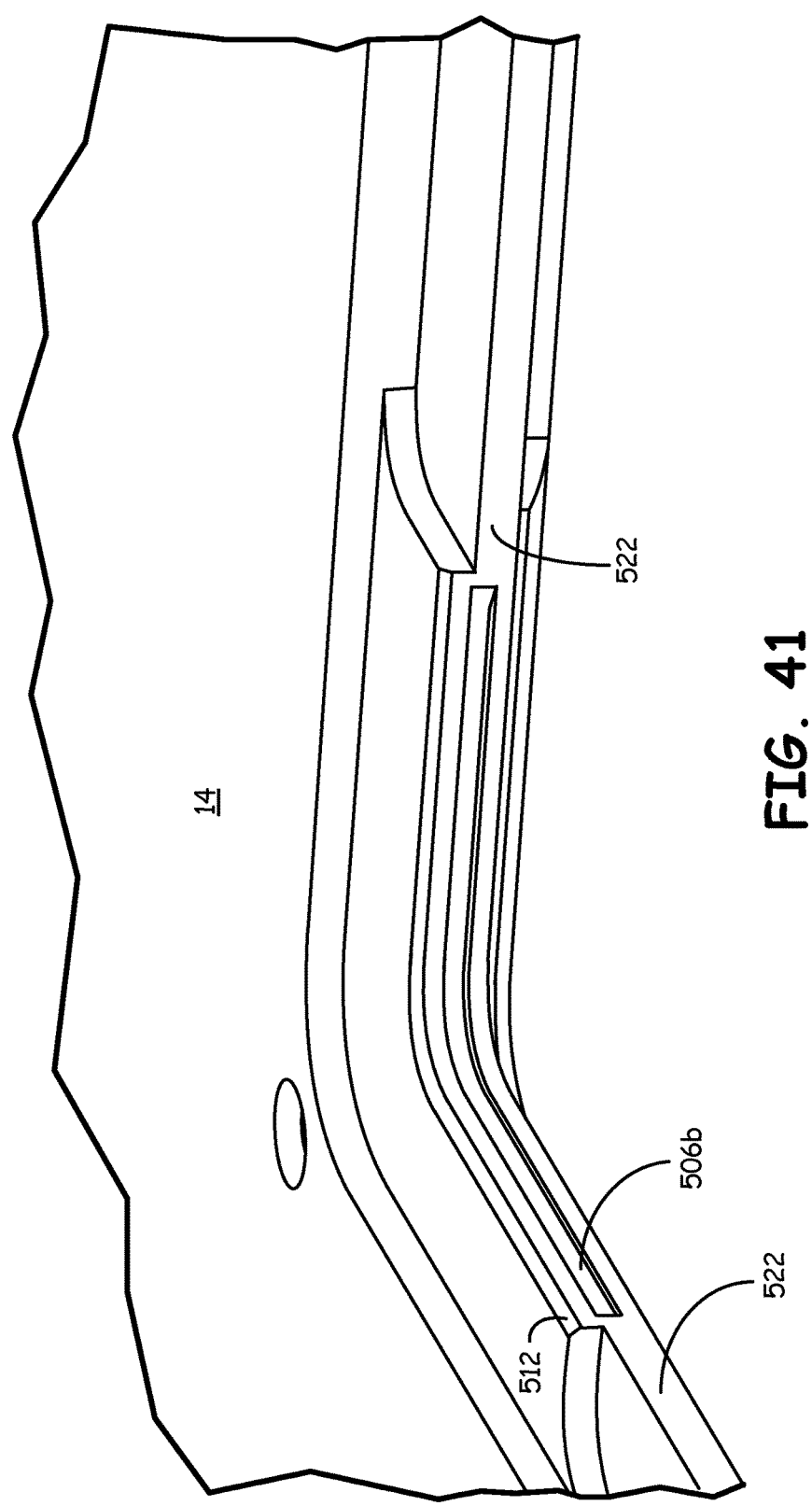
FIG. 41 is a close up partial perspective top view of a portion of a corner of the retainer.

In FIG. 37, retainer 14 has 4 corners 502*a*-*d*, each having intersection edges 504*a*-*h*, in pairs as shown. In FIG. 39, these edges can be seen with the guide plate removed. In one embodiment, corner 502*c* is designated the "registration or reference corner", though any corner is acceptable. Therefore at least edges 504*e*-*f* will be used for registration of the guide plate by means of biasing of the plate into that corner. In the preferred embodiment, edges 504*g* and 504*d* will also provide registration as they are in line with corner 504*c* edges. The driving corner which is diagonally opposite the registration corner is the primary location for bias elastomers. It is also possible that the remaining two corners can have elastomer bias. It is also possible that there are more or less than 4 corners such as in the case of a triangle or polygon but the same principles for precision alignment apply, namely that there is a registration corner (or more precisely, sidewalls adjacent that corner) which are precisely milled/formed for alignment and the remaining edges/corners of the shape can be used to drive the pin guide into that registration corner.

Figure 42:
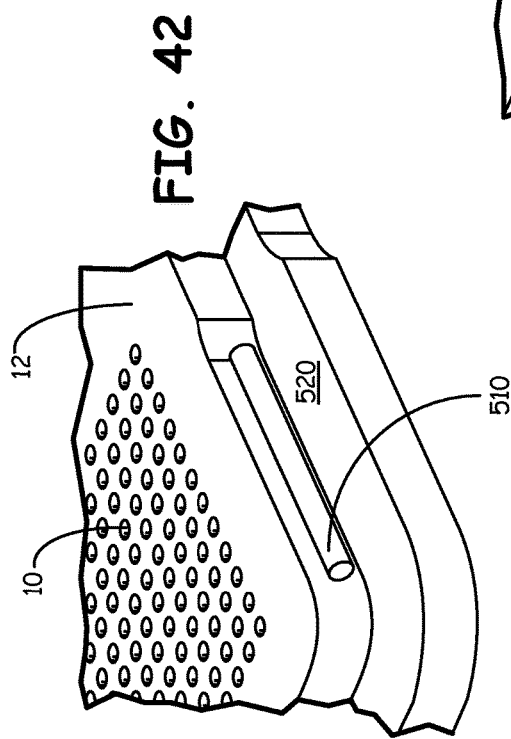
FIG. 42 is a close up partial perspective top view of a portion of one array showing the elastomer insert.
Figure 43:
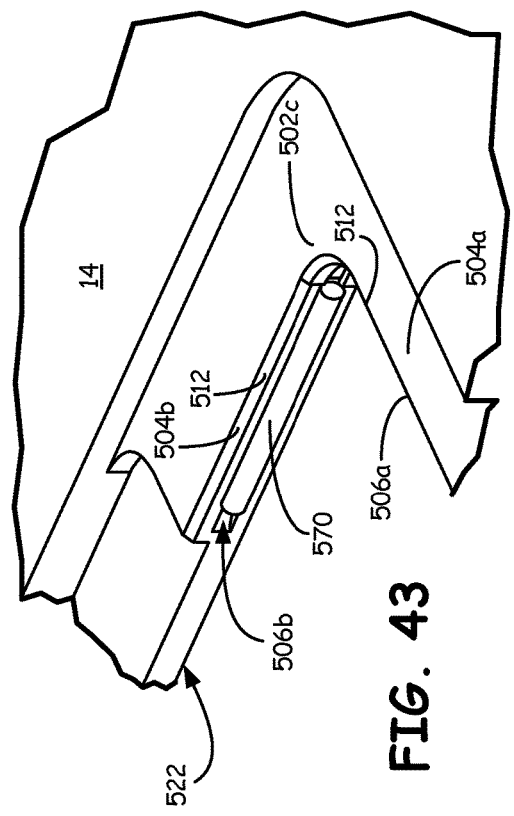
FIG. 43 is a close up partial perspective top view of a portion of a corner of the probe card plate/retainer showing an elastomer.

FIG. 43 provides a close up view of corner 502*a* illustrates the biasing mechanism, which is preferably provided by recesses 506*a* and 506*b* being provided in the sidewall. These recesses/notches are longitudinal along a portion of the sidewall and have a depth sufficient to receive and elastomeric cylindrical member 510. This member is also shown in FIG. 42 which shows a corner of the guide plate/pin guide 12, but it is the same member just shown in both locations. In the preferred embodiment, the corners of the pin guide 12 do not actually engage the corners of the retainer 14 because either the pin guide corners are cut away/reduced in radius or the retainer corners are cut deeper/increased radius. This insures that the sidewalls adjacent the corners are used for registration. If this was not done, a slight mismatch in the fit of the corners would prevent the sidewalls of the two parts from mating and providing precision registration.

At a minimum, one or two elastomers 510 are used to drive the pin guide 12 into the registration corner, but the preferred structure would provide elastomers in notches in all walls adjacent corners except that registration corner which must have material to material direct contact with no gaps.

To permit the insert of elastomers 510, the upper edges of the sidewalls adjacent corners are cut away/beveled slightly and clearance is provide in along the corners of the retainer for the same reason. Even the registration corner can have this cut away even if it is not used in order to allow any corner to be the registration corner. The elastomers may be rubber cylinder or other biasing elements. They are preferably fitted after the pin guide 12 is inserted into the retainer 14 and then glued in place, though they may be glued first and then the pin guide inserted. Arrows 530 (FIG. 39) illustrate the bias forces resultant from the elastomers, driving the pin guide into its registration corner.

Figure 44:
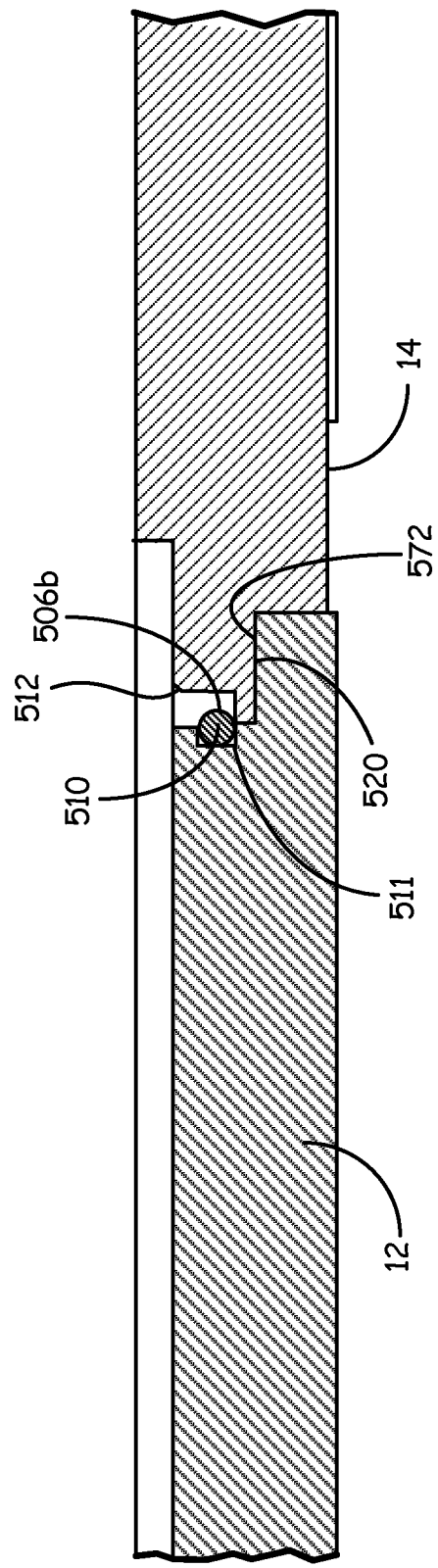
FIG. 44 is a cross sectional view of a pin guide, elastomer and retainer taken along an edge near a corner.

FIG. 44 illustrates a cross sectional view of the intersection between the retainer 14 and pin guide 12 at a corner with the elastomer in place. In this embodiment the pin guide is inserted from the bottom so that ledge 520 engages a ledge 522 on the retainer to prevent push-though. Note that the pin guide could be inserted from the top also with appropriate changes in the ledge and stop. Cut away recesses 526 (FIG. 38) may also be used to provide an insertion gap for removal of the guide.

The bias elastomer 512 resides in part in recess 506b, but in the preference embodiments, it also has a like recess 511 in the pin guide 12 so that the elastomer is fully captured from escape.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A test contact pin assembly for temporary contact with a test pad on a wafer level integrated circuit device under test (DUT) comprising:
   a. at least one slideable upper terminal pin, further having, a top extension for contacting the DUT, portion, at least one lateral cross member flange and a contact surface; said upper pin being slideable between an out of test position and an in-test position;
   b. at least one lower terminal pin having a foot and a like contact surface;
   c. said upper and lower pins being held in contact by bias forces which maintain their respective contacts surfaces together but in a slideable relationship to each other;
   d. an elastomeric material of predetermined height when in an uncompressed state, said material surrounding the pins to create said bias force;
   e. a substantially rigid top pin guide surface located atop said elastomeric material, including a pair of spaced part parallel walls defining a guide channel for said flange, an upper wall between said parallel walls defining an up-stop surface for said upper pin and an aperture in said up-stop surface for receiving an extended portion of said upper pin which protrudes beyond said guide surface to make contact with said DUT, said channel being sized to be large enough to receive said flange with minimum frictional contact the parallel walls; said up-stop surface providing an upward stop limit for the upper pin by virtue of its contact with the flange,
   f. said guide channel having a depth sufficient to contain said flange against rotation between pin travel distance occurring from said out of test position and said in test position, so that said upper and lower pin contacts surfaces are maximally in contact with each other throughout the pin travel distance.

2. The test assembly of claim 1 wherein said pin travel distance is defined as the distance between the highest point of the upper pin extension when in out of test position to the lowest point of said extension when in in-test position and wherein the depth of said channel is equal to or greater than said pin travel distance.

3. The assembly of claim 2 wherein the lowest point of said upper pin extension in in-test position is always greater than the height of any test pad on the DUT.

4. The assembly of claim 2 wherein the lowest point of said upper pin extension in in-test position is greater than one half the height of the DUT test pad.

5. The assembly of claim 1 wherein said upper guide surface includes a top surface and wherein said upper pin extension protrudes therefrom, and wherein said upper pin extension protrudes just past said top surface when in in-test position.

6. The test contact pin assembly of claim 1 wherein said elastomeric material is precompressed from its volume in an uncompressed state, to provide a more uniform force in response against said pin.

7. A test pin array assembly for making temporary contact of test pad integrated circuit device under test (DUT) comprising:
   a. an upper contact pin, configured to move downwardly along a Z-axis when in contact with said pads, the pin having;
      I. longitudinal upper portion, having a tip and a bottom end;
      II. a pair of laterally extending flanges, having a predetermined width and an upper edge, said flanges extending from said bottom end of said upper portion, and
      III. a lower portion extending from said flanges;
   b. a lower pin in slideable contact with the upper pin at said lower portion;
   c. an guide plate including an up-stop comprising:
      i. said plate having a bottom surface including a plurality of spaced part, parallel recesses with an up-stop barrier therebetween, said recesses sized to just receive said flanges with minimal frictional contact, and to confine said flanges in a predetermined orientation, at least one upper edge of said flanges contacting said up-stop barrier to define an upper travel limit for said upper contact pin;
      ii. wherein the height of at least one flange is less than or equal to the depth of at least one recess;
      so that the pins are confined against rotational movement and have an upper travel limit defined by said plate thereby keeping said pins aligned in all axes while permitting movement along the Z-axis.

8. The assembly of claim 7 wherein said guide plate includes substantially non-hydroscopic material with a low coefficient of expansion.

9. The assembly of claim 7 wherein said upper pin includes a crown having a chisel shape with two spaced part points.

10. The assembly of claim 7 wherein said upper pin includes a crown having a chisel shape with an arcuate hemispherical valley therebetween.

11. The test contact pin assembly of claim 7 wherein said elastomeric material is precompressed from its volume in an uncompressed state, to provide a more uniform force in response against said pin.

* * * * *